(12) United States Patent
Lutsen et al.

(10) Patent No.: US 8,449,985 B2
(45) Date of Patent: *May 28, 2013

(54) POLYIPTYCENYLENE VINYLENE AND METHOD OF MAKING THE SAME

(75) Inventors: Laurence Lutsen, Coudekerque-Branche (FR); Dirk Vanderzande, Hasselt (BE)

(73) Assignees: IMEC, Leuven (BE); Universiteit Hasselt, Diepenbeek (BE)

( * ) Notice: Subject to any disclaimer, the term of this patent is extended or adjusted under 35 U.S.C. 154(b) by 850 days.

This patent is subject to a terminal disclaimer.

(21) Appl. No.: 12/435,198

(22) Filed: May 4, 2009

(65) Prior Publication Data

US 2009/0246532 A1 Oct. 1, 2009

Related U.S. Application Data

(63) Continuation-in-part of application No. 12/183,937, filed on Jul. 31, 2008, now Pat. No. 8,173,999, which is a continuation-in-part of application No. 12/026,385, filed on Feb. 5, 2008, now Pat. No. 8,173,267.

(60) Provisional application No. 60/957,373, filed on Aug. 22, 2007, provisional application No. 61/051,284, filed on May 7, 2008, provisional application No. 61/051,268, filed on May 7, 2008, provisional application No. 61/051,268, filed on May 7, 2008, provisional application No. 61/051,284, filed on May 7, 2008.

(30) Foreign Application Priority Data

| Aug. 1, 2007 | (EP) | 07447045 |
| Aug. 1, 2008 | (EP) | 08161680 |
| Oct. 16, 2008 | (EP) | 08166820 |

(51) Int. Cl.
| B32B 9/04 | (2006.01) |
| B32B 27/00 | (2006.01) |
| B05D 3/10 | (2006.01) |
| C07C 13/465 | (2006.01) |
| C08G 61/00 | (2006.01) |

(52) U.S. Cl.
USPC ........ 428/522; 428/419; 427/340; 427/385.5; 585/19; 585/27; 528/396

(58) Field of Classification Search
None
See application file for complete search history.

(56) References Cited

U.S. PATENT DOCUMENTS

| 5,817,430 A | 10/1998 | Hsieh |
| 6,605,693 B1 * | 8/2003 | Becker et al. ............... 528/378 |
| 6,638,685 B2 | 10/2003 | Maeda |
| 6,660,479 B2 | 12/2003 | Kim |

(Continued)

OTHER PUBLICATIONS

Handbook of Chemistry and Physics 81$^{st}$ edition, CRC Press, pp. 8-44 to 8-56 (2000).

(Continued)

*Primary Examiner* — John J Figueroa
(74) *Attorney, Agent, or Firm* — Knobbe Martens Olson & Bear LLP

(57) ABSTRACT

Methods are provided for obtaining soluble or insoluble poly (iptycenylene vinylene) homo- and co-polymers via a soluble precursor polymer. The polymers obtained by the methods can be used in electronic or opto-electronic devices, e.g., chemosensors.

12 Claims, 3 Drawing Sheets

U.S. PATENT DOCUMENTS

| | | | |
|---|---|---|---|
| 6,689,530 | B2 | 2/2004 | Ohsawa |
| 8,173,999 | B2 * | 5/2012 | Lutsen et al. .................. 257/40 |
| 2006/0073607 | A1 | 4/2006 | Rose et al. |
| 2009/0246532 | A1 * | 10/2009 | Lutsen et al. .............. 428/411.1 |

OTHER PUBLICATIONS

Lutsen et al. "Highly selective route to unsymmetrically substituted 1-{2-[(butylsulfanyl)methyl]-5-(chloromethyl)-4-methoxyphenoxy}-3,7-dimethyloctane and isomers toward synthesis of conjugated polymer OC1C10 used in LEDs: Synthesis and optimization", Helvetica Chimica Acta, vol. 83, Issue 12, pp. 3113-3121 (2000).

Otsu et al., Polym. Bull., 11, 2, 135 (1984).

Otsu, T., J. Polym. Sci., Part A: Polym. Chem., 38, 12, 2121(2000).

Swager, T., JACS, vol. 126, p. 452 (2004).

* cited by examiner

POLYIPTYCENYLENE VINYLENE AND METHOD OF MAKING THE SAME

CROSS-REFERENCE TO RELATED APPLICATIONS

This application is a continuation-in-part of U.S. application Ser. No. 12/183,937 filed Jul. 31, 2008 now U.S. Pat. No. 8,173,999, which is a continuation-in-part of U.S. application Ser. No. 12/026,385 filed Feb. 5, 2008 now U.S. Pat. No. 8,173,267, which claims the benefit under 35 U.S.C. §119(e) of U.S. provisional application Ser. No. 60/957,373 filed Aug. 22, 2007, and claims the benefit under 35 U.S.C. §119(a)-(d) of European application No. 07447045.1 filed Aug. 1, 2007. U.S. application Ser. No. 12/183,937 claims the benefit under 35 U.S.C. §119(e) of U.S. provisional application Ser. No. 61/051,284 filed May 7, 2008, and U.S. provisional application Ser. No. 61/051,268 filed May 7, 2008. This application claims the benefit under 35 U.S.C. §119(e) of U.S. Provisional Application No. 61/051,268 filed May 7, 2008 and U.S. Provisional Application No. 61/051,284 filed May 7, 2008, and claims the benefit under 35 U.S.C. §119(a)-(d) of European Application No. EP 08161680.7 filed Aug. 1, 2008 and European Application No. EP 08166820.4 filed Oct. 16, 2008. The disclosures of each of the above-referenced applications are hereby expressly incorporated by reference in their entirety and are hereby expressly made a portion of this application.

FIELD OF THE INVENTION

Methods for synthesizing conjugated polymers for use in applications in electronics and opto-electronics are provided. In particular, a class of novel monomers, a method for producing such novel monomers, methods for the preparation of soluble precursor polymers of iptycenylene vinylene polymers, their conversion towards iptycenylene vinylene conjugated polymers, and to opto-electronic devices including the same are provided.

BACKGROUND OF THE INVENTION

Conjugated polymers are of great interest for the development of optical and electronic applications. The most investigated conjugated polymers are polyarylenes (such as e.g. poly(thiophene) (PT)), poly(arylene vinylene)s (such as e.g. poly(p-phenylene vinylene) (PPV) or poly(2,5-thienylene vinylene) (PTV)).

There is a continuous interest in polycyclic aromatic compounds, mostly as materials for opto-electronic applications (OLED, OFET, organic photovoltaics, sensors, etc).

The rigid three-dimensional (3D) iptycene units are interesting electron donor which can induce a porous structure into a bulk conjugated polymer.

Several methods have been developed for the synthesis of conjugated polymers containing rigid three-dimensional iptycene units: Poly(arylene vinylene) derivatives containing iptycene moieties (and more specifically triptycene units) were reported by T. Swager (U.S. Patent publication No. 2006/0073607A1 and JACS 2004, vol. 126, p. 452). These polymers were produced in a "one-pot" synthesis by polycondensation of para-dihalomethyl-substituted triptycene derivatives. Polymers containing iptycene units were also reported by H. Becker (U.S. Pat. No. 6,605,693) as electroluminescent materials. A list of particular methods for the preparation of poly(triptycenyl vinylenes) is given in U.S. Pat. No. 6,605,693 (e.g. polycondensation of para-dihalomethyl-substituted triptycene, Wessling precursor route, Homer and Wittig polymerization, Knoevenagel reaction).

A homopolymer according to formula (XIII) has been disclosed in US 2006/0073607.

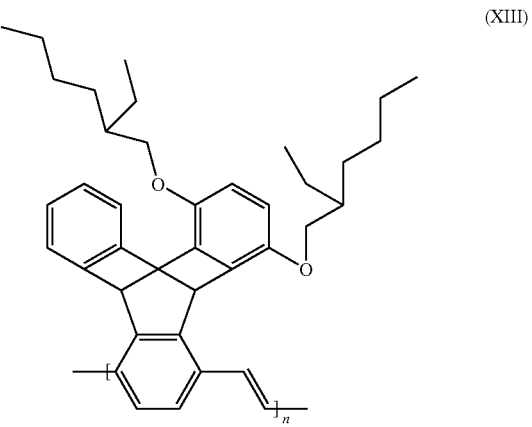 [SMILES: C/C=C/c1ccc(C)c2c1C1c3c(OCC(CC)CCCC)ccc(OCC(CC)CCCC)c3C13c1ccccc1C23]

(XIII)

This homopolymer is obtained by a direct route. Other iptycenylene vinylidene derivatives are disclosed in U.S. Pat. No. 6,605,693, which are copolymers comprising a high amount (75% or more) of phenylene vinylidene co-monomers. Those last polymers have also been synthesized according to a direct route. The synthetic scheme used so far in the prior art for synthesizing iptycenylene vinylene derivatives does not permit synthesis of poorly soluble iptycenylene vinylene derivatives. For instance it does not permit the synthesis of homopolymers of unsubstituted iptycenylene vinylidene of high molecular weight (e.g. above 10000 daltons) or copolymers of high molecular weight (e.g. above 10000 daltons) comprising a large amount of unsubstituted iptycenylene vinylene derivatives.

There is still a need in the art for a method versatile enough to permit the synthesis of a broad range of soluble or insoluble homo- and copolymers of iptycenylene vinylidene monomers. There is also a need in the art for new monomers and precursor polymers that can be converted into conjugated iptycenylene vinylidene polymers.

SUMMARY OF THE INVENTION

Novel monomers and a method for the synthesis of soluble or insoluble conjugated polymers like iptycenylene vinylene polymers, optionally in good yields, optionally with high molecular weight, optionally good quality, e.g. low defect level and optionally in large scale are provided.

Generally speaking, a first aspect relates to new monomers for the synthesis of an iptycenylene vinylene precursor polymer or co-polymer. In one embodiment, the first aspect relates to a class of monomers represented by the structural formula (I): Z—$CHR_3$—Ar—$CHR_4$—Z', wherein —Z and —Z' are independently selected from the group consisting of halogen, pseudo-halogen, —$S^+RR'X^-$, —S(O)R" and —$SC(S)R_0$, with the proviso that —Z and —Z' are not simultaneously halogen or pseudo-halogen, wherein Ar is selected from the group consisting of substituted and non-substituted triptycenylene, substituted and non-substituted pentiptycenylene and substituted and non-substituted iptycenylene, wherein $R_0$ is selected from the group consisting of —$NR_1R_2$, $C_1$-$C_{20}$ alkyloxy, aryloxy, alkyl, aryl, alkylaryl, arylalkyl, thioether, ester, carboxylic acid and heterocyclyl, wherein $R_1$ and $R_2$ are either independently selected from the group consisting of $C_1$-$C_{20}$-alkyl, $C_3$-$C_{20}$-cycloalkyl, aryl, $C_{1-4}$ alkyl-aryl, aryl-$C_{1-4}$ alkyl and heterocyclyl or $R_1$ and $R_2$ are linked together to form a cycle comprising 4 to 8 carbons, wherein R and R' are independently selected from the group consisting of $C_1$-$C_4$ alkyl or form together with the sulfur atom a tetrahydrothiophenium group wherein X is a counterion, wherein $R_3$ and $R_4$ are selected from the group consisting of hydrogen, $C_1$-$C_{20}$-alkyl group, a cyclic $C_3$-$C_{20}$-alkyl group, aryl groups, alkylaryl groups, arylalkyl groups and heterocyclic groups and wherein R'' is selected from the group consisting of $C_1$-$C_{10}$ alkyl and aryl. R and R' are independently selected from the group consisting of $C_1$-$C_4$ alkyl or form together with the sulfur atom a tetrahydrothiophenium group. X is a counterion (e.g. Cl, Br, F. and the like).

In a second aspect, a method is provided for the synthesis of a monomer according to the first aspect. In one embodiment of the second aspect, said method comprises the step of reacting a compound having the general formula (XXVIII):

$$X'—CHR_3—Ar—CHR_4—X'' \quad (XXVIII)$$

with a compound of general formula ZH or a salt thereof, wherein Ar, Z, $R_3$ and $R_4$ are as defined in any embodiments of the first aspect and wherein each of X' an X'' is an halogen or a pseudo-halogen.

In a third aspect, iptycenylene vinylene precursor polymers or co-polymers are provided having the advantage to be soluble in (at least one) common organic solvents such as for example THF, cyclohexanone, DMF, chloroform, DMSO, toluene, benzene, dichlorobenzene, dichloromethane, acetone or dioxane independently of the solubility of conjugated polymers obtained from such precursor polymers or co-polymers. This aspect includes a "precursor polymer route", e.g. wherein first a soluble iptycenylene vinylene precursor polymer is synthesized, which is then converted e.g. by heat treatment to a conjugated form. In an embodiment of the third aspect, a polymer represented by the general formula (IV) is presented:

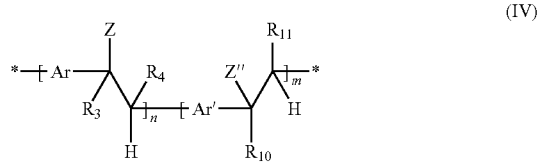

wherein Ar is selected from the group consisting of substituted and non-substituted triptycenylene, substituted and non-substituted pentiptycenylene and substituted and non-substituted iptycenylene, wherein Ar is arylene or heteroarylene optionally substituted with one or more substituents independently selected from the group consisting of $C_{1-20}$ alkyl, $C_{1-20}$ alkoxy, $C_{1-20}$ alkylsulfate, poly(ethylene oxide) (PEO) or oligo(ethylene oxide), aryl and aryl-$C_{1-4}$ alkyl, wherein said heteroarylene may comprise up to 4 heteroatoms independently selected from the group consisting of oxygen, sulfur, and nitrogen, wherein Z and Z'' are independently selected from the group consisting of —S$^+$RR'X$^-$, —S(O)R'', —SC(S)$R_0$ and —OR$_5$ wherein $R_3$, $R_4$, $R_{10}$ and $R_{11}$ are independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups and heterocyclic groups, wherein $R_0$ is selected from the group consisting of —NR$_1$R$_2$, $C_1$-$C_{20}$ alkyloxy, aryloxy, alkyl, aryl, alkylaryl, arylalkyl, thioether, ester, carboxylic acid and heterocyclyl, wherein $R_1$ and $R_2$ are either independently selected from the group consisting of $C_1$-$C_{20}$-alkyl, $C_3$-$C_{20}$-cycloalkyl, aryl, $C_{1-4}$ alkyl-aryl, aryl-$C_{1-4}$ alkyl and heterocyclyl or $R_1$ and $R_2$ are linked together to form a cycle comprising 4 to 8 carbons, wherein $R_5$ is a $C_{1-10}$ alkyl, wherein R and R' are independently selected from the group consisting of $C_1$-$C_4$ alkyl or form together with the sulfur atom a tetrahydrothiophenium group, wherein X is a counterion, wherein R'' is selected from the group consisting of $C_1$-$C_{10}$ alkyl and aryl, wherein n is from 5 to 2,000, and wherein m is from 0 to 2,000.

In a fourth aspect, methods are described the synthesis of precursor polymers and copolymers according to the third aspect. In an embodiment, a method for the preparation of a polymer according to the third aspect is presented, said method comprising the steps of:

providing a first monomer having the general formula (I):

$$Z—CHR_3—Ar—CHR_4—Z' \quad (I)$$

optionally providing a second monomer having the general formula (XXI)

$$Z''—CHR_{10}—Ar'—CHR_{11}—Z''' \quad (XXI)$$

and reacting said first monomer and optionally said second monomer with a basic compound in the presence of an organic solvent to obtain said precursor polymer, wherein —Z, —Z', —Z'' and —Z''' are independently selected from the group consisting of halogen, —S$^+$RR'X$^-$, —S(O)R'' and —SC(S)$R_0$ with the proviso that —Z and —Z' are not simultaneously halogen and that —Z'' and Z''' are not simultaneously halogen.

In a fifth aspect, conjugated polymers and copolymers are provided that are obtained upon thermal conversion of the iptycenylene vinylene precursor polymers defined in the third aspect. Those conjugated polymers can be either soluble or insoluble in common organic solvents (such as defined above). This is a major advantage of the preferred embodiments when compared with methods of the prior art which only enable the synthesis of soluble iptycenylene vinylene polymers or copolymers. In an embodiment of the fifth aspect, a polymer is provided comprising more than 25% of repeating units of the general formula (XXX):

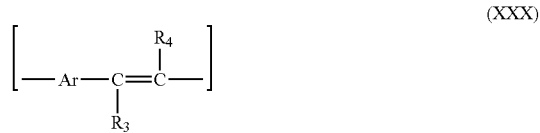

wherein Ar is selected from the group consisting of substituted and non-substituted triptycenylene, substituted and non-substituted pentiptycenylene and substituted and non-substituted iptycenylene, wherein $R_3$ and $R_4$ are independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups and heterocyclic groups, with the proviso that said polymer is not a homopolymer corresponding to the following formula (XIII):

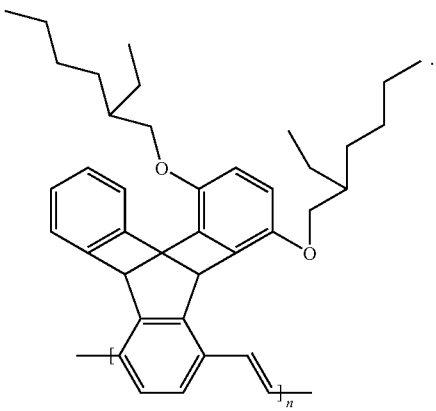

(XIII)

In a sixth aspect, methods are provided to convert iptycenylene vinylene precursor polymers of the third aspect into conjugated iptycenylene vinylene polymers of the fifth aspect. In one embodiment, a method is described for the synthesis of a bulk conjugated polymer comprising a 3-dimensional structure (iptycene derivatives). In another embodiment, a method for the synthesis of electroluminescent conjugated polymers, being useful in for example opto-electronic devices or sensors, is described. An embodiment of the sixth aspect relates to a method for the preparation of a polymer comprising structural units represented by the formula

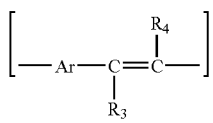

(XXX)

said method comprising the steps of:
providing at least one polymer according to any embodiment of the third aspect with the proviso that Z is not $S^+RR'X^-$ when m=0, and
subjecting said polymer to a thermal conversion step at a temperature between 30° C. and 300° C.

Another embodiment of the sixth aspect relates to a method for the preparation of a polymer comprising structural units

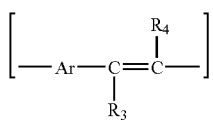

(XXX)

said method comprising the steps of:
providing at least one polymer having the general formula (XXII):

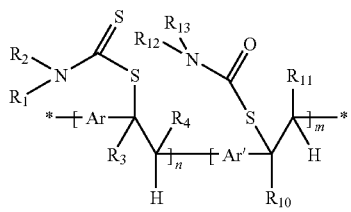

(XXII)

and,
reacting said polymer with an acid,
(the conversion step can be also done by heat only (thermal conversion) or heat+acid (acid catalyzed conversion))
wherein Ar is selected from the group consisting of substituted and non-substituted triptycenylene, substituted and non-substituted pentiptycenylene and substituted and non-substituted iptycenylene, wherein Ar' is arylene or heteroarylene optionally substituted with one or more substituents independently selected from the group consisting of $C_{1-20}$ alkyl, $C_{1-20}$ alkoxy, $C_{1-20}$ alkylsulfate, poly(ethylene oxide) (PEO) or oligo(ethylene oxide), poly(ethylene glycol) (PEG) or oligo(ethylene glycol), aryl and aryl-$C_{1-4}$ alkyl, wherein $R_3$, $R_4$, $R_{10}$ and $R_{11}$ are independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups and heterocyclic groups, wherein $R_{12}$ and $R_{13}$ are either independently selected from the group consisting of $C_1$-$C_{20}$-alkyl, $C_3$-$C_{20}$-cycloalkyl, aryl, $C_{1-4}$ alkyl-aryl, aryl-$C_{1-4}$ alkyl and heterocyclyl or $R_{12}$ and $R_{13}$ are linked together to form a cycle comprising 4 to 8 carbons, wherein $R_1$ and $R_2$ are either independently selected from the group consisting of $C_1$-$C_{20}$-alkyl, $C_3$-$C_{20}$-cycloalkyl, aryl, $C_{1-4}$ alkyl-aryl, aryl-$C_{1-4}$ alkyl and heterocyclyl or $R_1$ and $R_2$ are linked together to form a cycle comprising 4 to 8 carbons, wherein R and R' are independently selected from the group consisting of $C_1$-$C_4$ alkyl or form together with the sulfur atom a tetrahydrothiophenium group, wherein R" is selected from the group consisting of $C_1$-$C_{10}$ alkyl and aryl, wherein n is from 1 to 2,000, and wherein m is from 0 to 2,000.

In a seventh aspect, opto-electronic devices are provided incorporating either precursor polymers or conjugated polymers according to the previously defined embodiments. In certain embodiments, the use of these soluble or insoluble conjugated polymers for organic solar cells, organic transistors, LEDs, sensors and other kinds of electronic devices is described. In other embodiments, conjugated polymers for sensor applications are described. The conjugated polymers of the preferred embodiments (e.g. obtainable via a precursor synthesis method) exhibit a drastic reduction in fluorescence when an electrostatic interaction occurs in the presence of some specific analyte, such as electron-deficient nitroaromatic vapors or RDX. Therefore this conjugated polymer material is of interest for sensors applications. In certain embodiments, a sensor for explosive agents or explosive tracers such as for example 2,4,6-trinitrotoluene (TNT) or 2,4-dinitrotoluene (DNT) is described. In particular, sensors for the detection of DNT or TNT may comprise at least one layer of an iptycenylene vinylene conjugated polymer, or a precursor thereof, as defined herein. The 3-dimensional structure of the polymers of the preferred embodiments may allow for electrostatic interaction in the presence of an analyte, thereby inducing a detectable charge transfer in the conjugated molecule. In embodiments of the seventh aspect, an electronic device is provided comprising at least a layer comprising a polymer according to any embodiments of the third or fifth aspect.

In an eighth aspect, fabrication of such opto-electronic devices is provided, in particular including the deposition of at least one thin polymer layer according to the third or fifth aspect. In an embodiment of the eighth aspect, a method is provided of manufacturing an electronic device according to the seventh aspect, said method comprising the steps of applying a polymer according to third aspect on a substrate and subjecting said polymer to a heat treatment and/or an acid treatment so as to convert said polymer into a polymer according to the fifth aspect.

In a nutshell, the various aspects of the preferred embodiments enable the use of poly(iptycenylene vinylene) derivatives in plastic electronics thanks to, among others, the easy synthetic availability of the polymers via a soluble precursor permitting their manufacture on a large scale.

Embodiments present numerous advantages when compared to alternative solutions of the prior art. In particular, compared to a Gilch-like route, embodiments have the advantage of leading to polymers that can also be insoluble in their conjugated form. A Gilch-like route is a one-pot polymerization process which only allows the synthesis of soluble conjugated polymers; it is not a precursor route as is the case in the preferred embodiments.

Compared to the method of U.S. Pat. No. 5,817,430, which is a side chain approach like the Gilch route, the method according to the preferred embodiments does not require the use of chain end controlling additives to control the molecular weight in order to get soluble conjugated polymers. The method described according to various embodiments is a "precursor method" which does not require control of the polymer molecular weight. The resulting precursor polymers are always soluble polymers, whatever their molecular weight, and are soluble in common organic solvents (as defined above) even for very high molecular weights. The related soluble or insoluble conjugated polymers may easily be obtained in a second step by a conversion or elimination reaction under thermal treatment. When the conjugated polymer is insoluble in common organic solvents (as defined above), the elimination reaction may preferably be carried out on a thin film of the precursor polymer. When the conjugated polymer is soluble in common organic solvents (as defined above), the elimination reaction may be carried out either in solution or on thin polymer films.

These and other characteristics, features and advantages of the preferred embodiments will become apparent from the following detailed description.

DETAILED DESCRIPTION OF THE PREFERRED EMBODIMENT

Definitions

Figure 1:
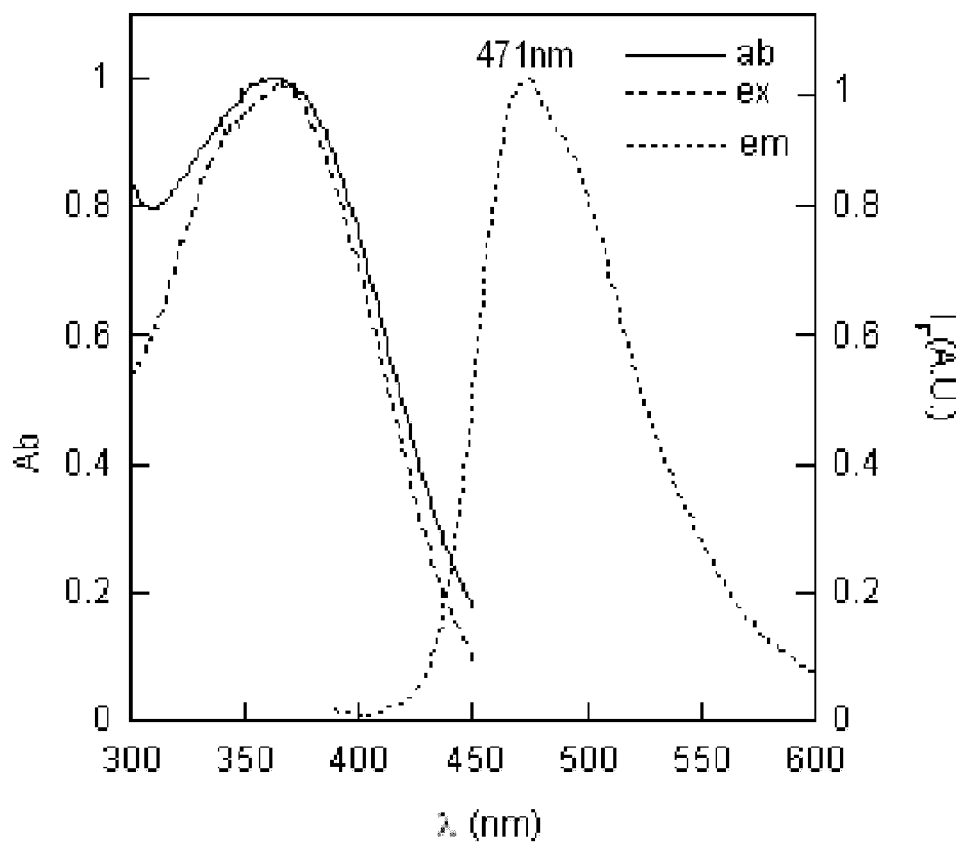
FIG. 1 is the absorption (ab), excitation (ex) and emission (em) spectra of a polymer according to an embodiment in spin-cast film.

As used herein and unless stated otherwise, the terms "$C_{1-7}$ alkyl" and "aliphatic saturated hydrocarbon radicals with 1 to 7 carbon atoms" are broad terms, and are to be given their ordinary and customary meaning to a person of ordinary skill in the art (and are not to be limited to a special or customized meaning), and refer without limitation to straight and branched chain saturated acyclic hydrocarbon monovalent radicals having from 1 to 7 carbon atoms such as, for example, methyl, ethyl, propyl, n-butyl, 1-methylethyl (isopropyl), 2-methylpropyl (isobutyl), 1,1-dimethylethyl (ter-butyl), 2-methylbutyl, n-pentyl, dimethylpropyl, n-hexyl, 2-methylpentyl, 3-methylpentyl, n-heptyl and the like; the term "$C_{1-4}$ alkyl" designate the corresponding radicals with only 1 to 4 carbon atoms, the term "$C_{1-10}$ alkyl" designate the corresponding radicals with only 1 to 10 carbon atoms, the term "$C_{1-20}$ alkyl" designates the corresponding radicals with only 1 to 20 carbon atoms, and so on.

As used herein with respect to a substituting radical, and unless otherwise stated, the term "$C_{1-7}$ alkylene" is a broad term, and is to be given its ordinary and customary meaning to a person of ordinary skill in the art (and is not to be limited to a special or customized meaning), and refers without limitation to the divalent hydrocarbon radical corresponding to the above defined $C_{1-7}$ alkyl, such as methylene, bis(methylene), tris(methylene), tetramethylene, hexamethylene and the like. The terms "$C_{1-10}$ alkylene" and "$C_{1-20}$ alkylene", refer to alkylenes having 1-10 and 1-20 carbon atoms, respectively.

As used herein and unless stated otherwise, the terms "$C_{3-10}$ cycloalkyl", "cyclic $C_3$-$C_{10}$-alkyl group" and "cycloaliphatic saturated hydrocarbon radical with 3 to 10 carbon atoms" are interchangeable terminology, and are to be given their ordinary and customary meaning to a person of ordinary skill in the art (and are not to be limited to a special or customized meaning), and refer without limitation to a mono- or polycyclic saturated hydrocarbon monovalent radical having from 3 to 10 carbon atoms, such as for instance cyclopropyl, cyclobutyl, cyclopentyl, cyclohexyl, cycloheptyl, cyclooctyl and the like, or a $C_{7-10}$ polycyclic saturated hydrocarbon monovalent radical having from 7 to 10 carbon atoms such as, for instance, norbornyl, fenchyl, trimethyltricycloheptyl or adamantyl. Similarly, a cyclic $C_3$-$C_{20}$-alkyl group designating a mono- or polycyclic saturated hydrocarbon monovalent radical having from 3 to 20 carbon atoms.

As used herein and unless provided otherwise, the term "arylalkyl" is a broad term, and is to be given its ordinary and customary meaning to a person of ordinary skill in the art (and is not to be limited to a special or customized meaning), and refers without limitation to an acyclic alkyl radical in which one of the hydrogen atoms bonded to a carbon atom, typically a terminal or $sp^3$ carbon atom, is replaced with an aryl radical. Typical arylalkyl groups include, but are not limited to, benzyl, 2-phenylethan-1-yl, naphthylmethyl, 2-naphthylethan-1-yl, naphthobenzyl, 2-naphthophenylethan-1-yl and the like. The arylalkyl group can comprise 6 to 20 carbon atoms, e.g., the alkyl moiety, including alkanyl, alkenyl or alkynyl groups, of the arylalkyl group is 1 to 6 carbon atoms and the aryl moiety is 5 to 14 carbon atoms.

As used herein and unless stated otherwise, the term "alkylaryl" is a broad term, and is to be given its ordinary and customary meaning to a person of ordinary skill in the art (and is not to be limited to a special or customized meaning), and refers without limitation to an aryl group having one or more alkyl substituents attached to the aryl group.

As used herein and unless stated otherwise, the terms "aryl" and "aromatic substituent" are interchangeable and are broad terms, and are to be given their ordinary and customary meaning to a person of ordinary skill in the art (and are not to be limited to a special or customized meaning), and refer without limitation to any mono- or polycyclic aromatic monovalent hydrocarbon radical having from 6 up to 30 carbon atoms such as but not limited to phenyl, naphthyl, anthracenyl, phenantracyl, fluoranthenyl, chrysenyl, pyrenyl, biphenylyl, terphenyl, picenyl, indenyl, biphenyl, indacenyl, benzocyclobutenyl, benzocyclooctenyl and the like, including fused benzo-$C_{4-8}$ cycloalkyl radicals (the latter being as defined above) such as, for instance, indanyl, tetrahydronaphtyl, fluorenyl and the like, all of the said radicals being optionally substituted with one or more substituents selected from the group consisting of halogen, amino, nitro, hydroxyl, sulfhydryl and nitro, such as for instance 4-fluorophenyl, 4-chlorophenyl, 3,4-dichlorophenyl or 4-cyanophenyl among others.

As used herein and unless stated otherwise, the term "arylene" is a broad term, and is to be given its ordinary and customary meaning to a person of ordinary skill in the art (and is not to be limited to a special or customized meaning), and refers without limitation to any mono- or polycyclic aromatic divalent hydrocarbon radical having preferably 6 up to 30 carbon atoms such as, but not limited to, derived from phenyl, naphthyl, anthracenyl, phenantracyl, fluoranthrenyl, chrysenyl, pyrenyl, biphenylyl, terphenyl, picenyl, indenyl, biphenyl, indacenyl, benzocyclobutenyl, benzocyclooctenyl and the like, including fused benzo-$C_{4-8}$ cycloalkyl radicals (the latter being as defined above) such as, for instance, indanyl, tetrahydronaphthyl, fluorenyl and the like, all of the said radicals being optionally substituted with one or more substituents independently selected from the group consisting of halogen, amino, nitro, hydroxyl, sulfhydryl and nitro, such as for instance 4-fluorophenyl, 4-chlorophenyl, 3,4-dichlorophenyl or 4-cyanophenyl among others.

As used herein and unless provided otherwise, the term "heteroarylene" is a broad term, and is to be given its ordinary and customary meaning to a person of ordinary skill in the art (and is not to be limited to a special or customized meaning), and refers without limitation to a monocyclic five- to seven-membered aromatic ring divalent radical, or to a polycyclic aromatic ring divalent radical, containing one or more nitrogen, oxygen, or sulfur heteroatoms, where N-oxides and sulfur monoxides and sulfur dioxides are permissible heteroaromatic substitutions, optionally substituted with one or more substituents independently selected from the group consisting of: $C_1$-$C_6$ alkyl, $C_1$-$C_6$ alkoxy, $C_1$-$C_6$ alkylsulfanyl, $C_1$-$C_6$ alkylsulfenyl, $C_1$-$C_6$ alkylsulfonyl, oxo, hydroxy, mercapto, amino optionally substituted by alkyl, carboxy, tetrazolyl, carbamoyl optionally substituted by alkyl, aminosulfonyl optionally substituted by alkyl, acyl, aroyl, heteroaroyl, acyloxy, aroyloxy, heteroaroyloxy, alkoxycarbonyl, nitro, cyano, halo, or $C_1$-$C_6$ perfluoroalkyl, multiple degrees of substitution being allowed. For polycyclic aromatic ring divalent radicals, one or more of the rings may contain one or more heteroatoms. Examples of "heteroarylene" include, but are not limited to, divalent radicals derived from furan-2,5-diyl, thiophene-2,4-diyl, 1,3,4-oxadiazole-2,5-diyl, 1,3,4-thiadiazole-2,5-diyl, 1,3-thiazole-2,4-diyl, 1,3-thiazole-2,5-diyl, pyridine-2,4-diyl, pyridine-2,3-diyl, pyridine-2,5-diyl, pyrimidine-2,4-diyl, quinoline-2,3-diyl, and the like.

As used herein and unless stated otherwise, the term "heterocyclic group" is a broad term, and is to be given its ordinary and customary meaning to a person of ordinary skill in the art (and is not to be limited to a special or customized meaning), and refers without limitation to a mono- or polycyclic, saturated or mono-unsaturated or polyunsaturated monovalent hydrocarbon radical having from 2 up to 15 carbon atoms and including one or more heteroatoms in one or more heterocyclic rings, each of said rings having from 3 to 10 atoms (and optionally further including one or more heteroatoms attached to one or more carbon atoms of said ring, for instance in the form of a carbonyl or thiocarbonyl or selenocarbonyl group, and/or to one or more heteroatoms of said ring, for instance in the form of a sulfone, sulfoxide, N-oxide, phosphate, phosphonate or selenium oxide group), each of said heteroatoms being independently selected from the group consisting of nitrogen, oxygen, sulfur, selenium and phosphorus, also including radicals wherein a heterocyclic ring is fused to one or more aromatic hydrocarbon rings for instance in the form of benzo-fused, dibenzo-fused and naphtho-fused heterocyclic radicals; within this definition are included heterocyclic radicals such as, but not limited to, diazepinyl, oxadiazinyl, thiadiazinyl, dithiazinyl, triazolonyl, diazepinonyl, triazepinyl, triazepinonyl, tetrazepinonyl, benzoquinolinyl, benzothiazinyl, benzothiazinonyl, benzoxathiinyl, benzodioxinyl, benzodithiinyl, benzoxazepinyl, benzothiazepinyl, benzodiazepinyl, benzodioxepinyl, benzodithiepinyl, benzoxazocinyl, benzothiazocinyl, benzodiazocinyl, benzoxathiocinyl, benzo-dioxocinyl, benzotrioxepinyl, benzoxathiazepinyl, benzoxadiazepinyl, benzothiadiazepinyl, benzotriazepinyl, benzoxathiepinyl, benzotriazinonyl, benzoxazolinonyl, azetidinonyl, azaspiroundecyl, dithiaspirodecyl, selenazinyl, selenazolyl, selenophenyl, hypoxanthinyl, azahypoxanthinyl, bipyrazinyl, bipyridinyl, oxazolidinyl, diselenopyrimidinyl, benzodioxocinyl, benzopyrenyl, benzopyranonyl, benzophenazinyl, benzoquinolizinyl, dibenzocarbazolyl, dibenzoacridinyl, dibenzophenazinyl, dibenzothiepinyl, dibenzooxepinyl, dibenzopyranonyl, dibenzoquinoxalinyl, dibenzothiazepinyl, dibenzoisoquinolinyl, tetraazaadamantyl, thiatetraazaadamantyl, oxauracil, oxazinyl, dibenzothiophenyl, dibenzofuranyl, oxazolinyl, oxazolonyl, azaindolyl, azolonyl, thiazolinyl, thiazolonyl, thiazolidinyl, thiazanyl, pyrimidonyl, thiopyrimidonyl, thiamorpholinyl, azlactonyl, naphtindazolyl, naphtindolyl, naphtothiazolyl, naphtothioxolyl, naphtoxindolyl, naphtotriazolyl, naphtopyranyl, oxabicycloheptyl, azabenzimidazolyl, azacycloheptyl, azacyclooctyl, azacyclononyl, azabicyclononyl, tetrahydrofuryl, tetrahydropyranyl, tetrahydropyronyl, tetrahydroquinoleinyl, tetrahydrothienyl and dioxide thereof, dihydrothienyl dioxide, dioxindolyl, dioxinyl, dioxenyl, dioxazinyl, thioxanyl, thioxolyl, thiourazolyl, thiotriazolyl, thiopyranyl, thiopyronyl, coumarinyl, quinoleinyl, oxyquinoleinyl, quinuclidinyl, xanthinyl, dihydropyranyl, benzodihydrofuryl, benzothiopyronyl, benzothiopyranyl, benzoxazinyl, benzoxazolyl, benzodioxolyl, benzodioxanyl, benzothiadiazolyl, benzotriazinyl, benzothiazolyl, benzoxazolyl, phenothioxinyl, phenothiazolyl, phenothienyl (benzothiofuranyl), phenopyronyl, phenoxazolyl, pyridinyl, dihydropyridinyl, tetrahydropyridinyl, piperidinyl, morpholinyl, thiomorpholinyl, pyrazinyl, pyrimidinyl, pyridazinyl, triazinyl, tetrazinyl, triazolyl, benzotriazolyl, tetrazolyl, fimidazolyl, pyrazolyl, thiazolyl, thiadiazolyl, isothiazolyl, oxazolyl, oxadiazolyl, pyrrolyl, furyl, dihydrofuryl, furoyl, hydantoinyl, dioxolanyl, dioxolyl, dithianyl, dithienyl, dithiinyl, thienyl, indolyl, indazolyl, benzofuryl, quinolyl, quinazolinyl, quinoxalinyl, carbazolyl, phenoxazinyl, phenothiazinyl, xanthenyl, purinyl, benzothienyl, naphtothienyl, thianthrenyl, pyranyl, pyronyl, benzopyronyl, isobenzofuranyl, chromenyl, phenoxathiinyl, indolizinyl, quinolizinyl, isoquinolyl, phthalazinyl, naphthiridinyl, cinnolinyl, pteridinyl, carbolinyl, acridinyl, perimidinyl, phenanthrolinyl, phenazinyl, phenothiazinyl, imidazolinyl, imidazolidinyl, benzimidazolyl, pyrazolinyl, pyrazolidinyl, pyrrolinyl, pyrrolidinyl, piperazinyl, uridinyl, thymidinyl, cytidinyl, azirinyl, aziridinyl, diazirinyl, diaziridinyl, oxiranyl, oxaziridinyl, dioxiranyl, thiiranyl, azetyl, dihydroazetyl, azetidinyl, oxetyl, oxetanyl, thietyl, thietanyl, diazabicyclooctyl, diazetyl, diaziridinonyl, diaziridinethionyl, chromanyl, chromanonyl, thiochromanyl, thiochromanonyl, thiochromenyl, benzofuranyl, benzisothiazolyl, benzocarbazolyl, benzochromonyl, benzisoalloxazinyl, benzocoumarinyl, thiocoumarinyl, phenometoxazinyl, phenoparoxazinyl, phentriazinyl, thiodiazinyl, thiodiazolyl, indoxyl, thioindoxyl, benzodiazinyl (e.g. phthalazinyl), phthalidyl, phthalimidinyl, phthalazonyl, alloxazinyl, dibenzopyronyl (i.e. xanthonyl), xanthionyl, isatyl, isopyrazolyl, isopyrazolonyl, urazolyl, urazinyl, uretinyl, uretidinyl, succinyl, succinimido, benzylsultimyl, benzylsultamyl and the like, including all possible isomeric forms thereof, wherein each carbon atom of said heterocyclic ring may be independently substituted with a substituent selected from the group consisting of halogen, nitro, $C_{1-7}$ alkyl (optionally containing one or more functions or radicals selected from the group consisting of carbonyl (oxo), alcohol (hydroxyl), ether (alkoxy), acetal, amino, imino, oximino, alkyloximino, amino-acid, cyano, carboxylic acid ester or amide, nitro, thio $C_{1-7}$ alkyl, thio $C_{3-10}$ cycloalkyl, $C_{1-7}$ alkylamino, cycloalkylamino, alkenylamino, cycloalkenylamino, alkynylamino, arylamino, arylalkylamino, hydroxyalkylamino, mercaptoalkylamino, heterocyclic amino, hydrazino, alkylhydrazino, phenylhydrazino, sulfonyl, sulfonamido and halogen), $C_{2-7}$ alkenyl, $C_{2-7}$ alkynyl, halo $C_{1-7}$ alkyl, $C_{3-10}$ cycloalkyl, aryl, arylalkyl, alkylaryl, alkylacyl, arylacyl, hydroxyl, amino, $C_{1-7}$ alkylamino, cycloalkylamino, alkenylamino, cyclo-alkenylamino, alkynylamino, arylamino, arylalkylamino, hydroxyalkylamino, mercaptoalkylamino, heterocyclic amino, hydrazino, alkylhydrazino, phenylhydrazino, sulfhydryl, $C_{1-7}$ alkoxy, $C_{3-10}$ cycloalkoxy, aryloxy, arylalkyloxy, oxyheterocyclic, heterocyclic-substituted alkyloxy, thio $C_{1-7}$ alkyl, thio $C_{3-10}$ cycloalkyl, thioaryl, thioheterocyclic, arylalkylthio, heterocyclic-substituted alkylthio, formyl, hydroxylamino, cyano, carboxylic acid or esters or thioesters or amides thereof, thiocarboxylic acid or esters or thioesters or amides thereof; depending upon the number of unsaturations in the 3 to 10 membered ring, heterocyclic radicals may be sub-divided into heteroaromatic (or "heteroaryl") radicals and non-aromatic heterocyclic radicals; when a heteroatom of the said non-aromatic heterocyclic radical is nitrogen, the latter may be substituted with a substituent selected from the group consisting of $C_{1-7}$ alkyl, $C_{3-10}$ cycloalkyl, aryl, arylalkyl and alkylaryl.

As used and unless stated otherwise, the terms "$C_{1-7}$ alkoxy" is a broad term, and is to be given its ordinary and customary meaning to a person of ordinary skill in the art (and is not to be limited to a special or customized meaning), and refers without limitation to substituents wherein a $C_{1-7}$ alkyl radical is attached to an oxygen atom through a single bond such as but not limited to methoxy, ethoxy, propoxy, butoxy, pentoxy, isopropoxy, sec-butoxy, tert-butoxy, isopentoxy, cyclopropyloxy, cyclobutyloxy, cyclopentyloxy and the likes.

As used herein and unless stated otherwise, the term "aryloxy" is a broad term, and is to be given its ordinary and customary meaning to a person of ordinary skill in the art (and is not to be limited to a special or customized meaning), and refers without limitation to substituents wherein an aryl radical is attached to an oxygen atom through a single bond such as but not limited to phenyloxy and the likes.

As used herein and unless stated otherwise, the term "thioether" refers to, e.g., "thio $C_{1-7}$ alkyl", "thio $C_{3-10}$ cycloalkyl", "arylthio", "arylalkylthio" and "thioheterocyclic", and is a broad term, and is to be given its ordinary and customary meaning to a person of ordinary skill in the art (and is not to be limited to a special or customized meaning), and refers without limitation to radicals attached to a divalent sulfur atom through a single bond such as but not limited to thiomethyl, thioethyl, thiopropyl, thiobutyl, thiopentyl, thiocyclopropyl, thiocyclobutyl, thiocyclopentyl, thiophenyl and the likes.

As used herein, and unless provided otherwise, the term "ester" is a broad term, and is to be given its ordinary and customary meaning to a person of ordinary skill in the art (and is not to be limited to a special or customized meaning), and refers without limitation to a compound having a COO-alkyl group where alkyl is as defined above. The ester typically has 2 to 30, 2 to 20, or 2 to 10 carbon atoms.

As used herein, and unless provided otherwise, the terms "$C_{3-10}$ cycloalkoxy", "aryloxy", "arylalkyloxy" and "oxyheterocyclic" are broad terms, and are to be given their ordinary and customary meaning to a person of ordinary skill in the art (and are not to be limited to a special or customized meaning), and refer without limitation to substituents wherein respectively a $C_{3-10}$ cycloalkyl, aryl, arylalkyl or heterocyclic radical (each of them such as defined herein), are attached to an oxygen atom or a divalent sulfur atom through a single bond, such as but not limited to, benzyloxy, mercaptobenzyl, cresoxy, and the like.

As used herein and unless provided otherwise, the term "counterion" is a broad term, and is to be given its ordinary and customary meaning to a person of ordinary skill in the art (and is not to be limited to a special or customized meaning), and refers without limitation to a positive or to a negatively charged ion which operate to balance a corresponding oppositely charged species. Examples of negative counterions include, but are not limited to halogens, pseudohalogens, sulfate, benzene sulfonate, p-toluenesulfonate, p-bromobenzenesulfonate, methanesulfonate, trifluoromethanesulfonate, phosphate, perchlorate, tetrafluoroborate, tetraphenylboride, nitrate and anions of aromatic or aliphatic carboxylic acids. Positive counterions comprise singly or multiply positively charged moieties that are metallic or non-metallic such as but not limited to $Na^+$, $K^+$, $Li^+$, $NH_4^+$ and the likes.

As used herein and unless stated otherwise, the term "halogen" is a broad term, and is to be given its ordinary and customary meaning to a person of ordinary skill in the art (and is not to be limited to a special or customized meaning), and refers without limitation to an atom selected from the group consisting of fluorine, chlorine, bromine and iodine.

As used herein and unless stated otherwise, the term "pseudo-halogen" is a broad term, and is to be given its ordinary and customary meaning to a person of ordinary skill in the art (and is not to be limited to a special or customized meaning), and refers without limitation to a chemical moiety behaving like a halogen within the context of the relevant chemical reactions involved. Examples of pseudo-halogens include, but are not limited to, trifluoromethylmethanesulfonyl, para-toluenesulfonyl, methanesulfonyl and the like.

As used herein with respect to a substituting radical, and unless otherwise stated, the terms "arylalkyl", "arylalkenyl" and "heterocyclic-substituted alkyl" are broad terms, and are to be given their ordinary and customary meaning to a person of ordinary skill in the art (and are not to be limited to a special or customized meaning), and refer without limitation to an aliphatic saturated or unsaturated hydrocarbon monovalent radical (preferably a $C_{1-7}$ alkyl or $C_{2-7}$ alkenyl radical such as defined above) onto which an aryl or heterocyclic radical (such as defined above) is already bonded, and wherein the said aliphatic radical and/or the said aryl or heterocyclic radical may be optionally substituted with one or more substituents selected from the group consisting of halogen, amino, nitro, hydroxyl, sulfhydryl and nitro, such as but not limited to benzyl, 4-chlorobenzyl, phenylethyl, 1-amino-2-phenylethyl, 1-amino-2-[4-hydroxyphenyl]ethyl, 1-amino-2-[indol-2-yl]ethyl, styryl, pyridylmethyl, pyridylethyl, 2-(2-pyridyl)isopropyl, oxazolylbutyl, 2-thienylmethyl and 2-furylmethyl.

As used herein and unless stated otherwise, the term "iptycenylene" is a broad term, and is to be given its ordinary and customary meaning to a person of ordinary skill in the art (and is not to be limited to a special or customized meaning), and refers without limitation to a rigid three-dimensional divalent group comprising at least a unit wherein three unsaturated ring systems are bridged together via a tricyclic[2,2,2]bicyclooctane ring system. The three unsaturated ring systems comprise always at least one phenyl derivative (e.g. a substituted or unsubstituted phenyl or a substituted or unsubstituted naphthyl). The two other unsaturated ring systems are selected from the list consisting of cyclic aromatic (e.g. phenyl), polycyclic aromatic (e.g. naphthyl) or cycloalkene structures (e.g. cyclobutadiene). The point of attachment of the iptycenylene moiety in a monomer or polymer according to embodiments of the first, third or fifth aspect are two positions in para of one another on one of the phenyl ring comprised in the iptycenenylene moiety. Iptycenes include triptycenes (3 unsaturated ring systems bridged via a tricyclic [2,2,2]bicyclooctane ring system) and pentiptycenes (5 unsaturated ring systems bridged via two tricyclic[2,2,2]bicyclooctane ring systems, wherein a first of the five unsaturated ring system is directly bonded to each of said tricyclic [2,2,2]bicyclooctane ring systems, wherein a second and a third of the five unsaturated ring systems is directly bonded to only one of said tricyclic[2,2,2]bicyclooctane ring systems and wherein a forth and a fifth of the five unsaturated ring systems is directly bonded to the other of said tricyclic[2,2,2]bicyclooctane ring systems). Examples of iptycenylene moieties are presented in formulas V-XI.

The preferred embodiments will be described with respect to various particular embodiments but the invention is not limited thereto but only by the claims.

In a first aspect, the preferred embodiments relate to a monomer represented by the following general formula (I):

$$Z\text{—}CHR_3\text{—}Ar\text{—}CHR_4\text{—}Z'  \qquad (I)$$

This monomer can be synthesized according to a method of the second aspect and can be polymerized or copolymerized according to a method of the forth aspect to obtain a polymer (usually referred to as being a precursor polymer) according to an embodiment of the third aspect. This precursor polymer can in turn be converted according to a method of the sixth aspect into a conjugated polymer or copolymer according to an embodiment of the fifth aspect. In other words, in a fourth aspect, the synthesis of a soluble precursor polymer starting from at least a monomer (I) according to the first aspect is provided. The preferred embodiments also provide the synthesis of said monomer (I). The sixth aspect comprises the conversion reaction of the soluble precursor polymer to the related conjugated polymer which may be soluble or insoluble depending on the chemical structure.

In the first aspect, Ar is an iptycenylene derivative selected from the group consisting of substituted and non-substituted triptycenylene and substituted and non-substituted pentiptycenylene. Preferably, the substituents on the iptycenylene derivative can be linear or branched $C_{1-20}$ alkyl and $C_{1-20}$ alkoxy and wherein, if the main chain of said linear or branched $C_{1-20}$ alkyl or $C_{1-20}$ alkoxy includes at least 3 carbon atoms, one or more non-adjacent CH or $CH_2$ divalent groups of said linear or branched $C_{1-20}$ alkyl and $C_{1-20}$ alkoxy may independently be replaced by O, S, C(=O), C(=O)O, OC(=O), NH, N—$C_{1-4}$ alkyl or NC(=O) and/or wherein one or more hydrogens may be each independently replaced by a substituent selected from the group consisting of fluoro, chloro, aryl, aryloxy, COOR*, $SO_3R^*$, CN, and $NO_2$ wherein R* is selected from the group consisting of $C_{1-20}$ alkyl, $C_{2-20}$ alkenyl and aryl. If the substituent(s) on the iptycenylene derivative is an alkoxy, $C_3$-$C_{20}$ alkoxy are preferred. In embodiments, the substituent(s) on the iptycenylene derivative may be selected from the group consisting of $C_1$-$C_{20}$-alkyl, $C_3$-$C_{20}$-alkoxy, $C_1$-$C_{20}$-alkylsulfate and salts thereof, oligo or poly(ethylene oxide) (PEO), a phenyl group or a benzyl group.

—Z and —Z' are preferably independently selected from the group consisting of halogen, pseudo-halogen, —S$^+$RR'X$^-$, —S(O)R", —SC(S)$R_0$ and —OR$_5$ with preferably the proviso that —Z and —Z' are not simultaneously halogen or pseudo-halogen. This is advantageous as such monomers can be polymerized to a soluble, non conjugated precursor polymer. Monomers wherein Z and Z' are simultaneously halogen or pseudo-halogen usually do not lead to a soluble, non-conjugated, precursor polymers but directly lead to a conjugated polymer or, when great care is taken to use only one equivalent of base, to a precursor polymer (in a hardly reproducible way) comprising often conjugated portions.

$R_0$ is preferably selected from the group consisting of —NR$_1$R$_2$, $C_1$-$C_{20}$ alkyloxy (preferably $C_5$-$C_{20}$), aryloxy, alkyl (e.g. $C_1$-$C_{20}$-alkyl group), cyclic alkyl (e.g. $C_4$-$C_{20}$ cyclic alkyl), aryl (e.g. phenyl), alkylaryl, arylalkyl (e.g. benzyl), thioether, ester, carboxylic acid and heterocyclyl. The alkyl (e.g. $C_1$-$C_{20}$-alkyl group), cyclic alkyl (e.g. $C_4$-$C_{20}$-cyclic alkyl group), aryl (e.g. phenyl group) and arylalkyl (e.g. benzyl group) may comprise heteroatoms and substituents such as e.g. halogens. For instance, Ro may be —OC$_6$F$_6$. $R_1$ and $R_2$ are either independently selected from the group consisting of $C_1$-$C_{20}$-alkyl, $C_3$-$C_{20}$-cycloalkyl, aryl, $C_{1-4}$ alkyl-aryl, aryl-$C_{1-4}$ alkyl and heterocyclyl or $R_1$ and $R_2$ are linked together to form a cycle comprising 4 to 8 carbons. $R_1$ and $R_2$ are preferably $C_1$-$C_{20}$ alkyl or phenyl. For instance, $R_1$ and $R_2$ can be selected from the group consisting of methyl, ethyl, propyl (e.g. isopropyl) and phenyl.

R and R' are independently selected from the group consisting of $C_1$-$C_4$ alkyl or form together with the sulfur atom a tetrahydrothiophenium group. X is a counterion. $R_3$ and $R_4$ are selected from the group consisting of hydrogen, $C_1$-$C_{20}$-alkyl group, a cyclic $C_3$-$C_{20}$-alkyl group (preferably $C_4$-$C_{20}$-alkyl group), aryl groups (e.g. phenyl), alkylaryl groups, arylalkyl (e.g. benzyl) groups and heterocyclic groups and wherein R" is selected from the group consisting of $C_1$-$C_{10}$ alkyl and aryl. $R_3$ and $R_4$ may comprise further heteroatoms and substituents.

In a preferred embodiment, $R_3$ and $R_4$ may be hydrogen.

All possible combinations of Z, Z', $R_3$, $R_4$ and Ar are embodiments with the proviso that with the proviso that —Z and —Z' are not simultaneously halogen or pseudo-halogen.

In an embodiment of the first aspect, the starting monomer(s) may be symmetrical. Symmetrical starting monomers have the advantage that they are easier the synthesis of than asymmetric starting monomers. Precursor polymers synthesized from a monomer having a symmetrical structure may be much easier the synthesis of and to obtain in good yield. Fewer or no complicated purification step by chromatography column of the monomer is requested.

In an embodiment of the first aspect, Z and Z' may both be —SC(S)$R_0$. This embodiment is advantageous because such monomers, once polymerized, lead to a precursor polymer, soluble in common organic solvents, which can be converted to a conjugated polymer via an acid treatment without heating or with a moderate heating. This permits one to obtain a conjugated polyiptycenylene vinylene polymer via a precursor route on temperature sensible substrate. $R_0$ may for instance be $NR_1R_2$. Symmetrical starting monomers with dithiocarbamate groups are stable in time. Embodiments, when dithiocarbamate leaving groups are used for the monomers, present numerous advantages when compared to alternatives according to other embodiments. Compared to the Wessling route, useable according to embodiments, embodiments involving dithiocarbamate leaving groups lead to polymerization with a lesser tendency toward gel formation and requiring no (or less) toxic gas (like strong acids) during the conversion reaction. Compared to the sulfinyl route according to embodiments, embodiment using symmetrical, dithiocarbamate containing monomers have the additional advantage of making use of more stable monomers.

Compared to a bis-sulfide route according to embodiments, embodiment using symmetrical, dithiocarbamate containing monomers have the additional advantage of leading to polymers by means of polymerization of monomers which are more stable and therefore allow the synthesis of polymers for which the instability of the monomers can be a problem to obtain such polymer in a reliable way. In a bis-sulfide route, over-oxidation can occur relatively easily as the oxidation of the sulfide groups is carried out after polymerization and not on the starting monomer. Using symmetrical dithiocarbamate containing monomers permits to reduce the number of structural defects and therefore to achieve a positive effect on the charge mobility of the conjugated polymers obtained.

Compared to the bis-xanthate route according to embodiments, embodiment using symmetrical, dithiocarbamate containing monomers have the additional advantage of leading to:

monomers and soluble precursor polymers more stable in time in inert atmosphere.

precursors and conjugated polymers with a much lower polydispersity in the range 1-15 and usually around 2 to 3 (while being between 20 and 30 for the xanthate-route).

Better reproducibility between batches.

precursor polymers obtained through polymerization reaction carried out at a temperature ranging from −78° C. to 30° C.

the yield of the polymerization reaction is higher (higher than 50%).

conjugated polymers with lower defect level.

Also, large-scale synthesis is easier. This embodiment is illustrated in example 1.4-1.5.

An embodiment according to the first aspect is compound (XXIV) having the general formula:

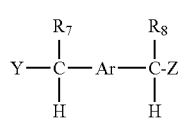

(XXIV)

wherein Z may be a leaving group. In a preferred embodiment, Z may be selected from the group consisting of Cl, Br, I, —O-Tos, —O-Mes, —O-Triflates, —$(NR_1R_1R_1)^+$, —$(SR_1R_2)^+$, —$OOCR_1$ and —$SC(S)OR_1$. In the above formula, Y may be a polarizer group and may be selected form the group consisting of —$SR_1$, —$OR_1$, —OH, —Cl, —Br, —SO—$R_1$, —CN, —CO—$OR_1$ and —S—$C(S)OR_1$, with the proviso that Y and Z are not both halogens. Preferably with the proviso that Y and Z are not both either halogen or pseudohalogen. For instance, if both Y and Z are halogens, or if Y is halogen and Z is pseudohalogen, although it is possible to obtain a precursor polymer, it is not obtainable in a reproducible way (for instance, partial conjugation will often occur). $R_7$ and $R_8$ may independently be —H, $R_1$, and wherein Ar may be an aromatic or heteroaromatic divalent group. In a preferred embodiment, Ar may comprise 4 to 20 carbon atoms. In another embodiment, Ar may be a rigid three-dimensional group. In another embodiment, each of the Ar groups may be substituted with one or more substituents independently selected from the group consisting of $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl group or a benzyl group. These Ar groups may comprise up to 4 heteroatoms chosen from the group comprising oxygen, sulfur, and nitrogen in the aromatic cyclic system. The substituents on Ar groups may be independently linear, or cyclic, or two of these substituents may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene, 2,5-thienylene, triptycenylene, pentiptycenylene, or iptycenylene, and most preferably Ar may be iptycenylene, triptycenylene or pentiptycenylene.

$R_1$, $R_2$, $R_3$ may be equal to $R_1$, $R_2$, $R_3$ as defined for compound (II).

In another embodiment, Z may be a halogen or a pseudo-halogen and Z' may be S(O)R''. Alternatively, Z' may be a halogen or a pseudo-halogen and Z may be S(O)R''. Z (e.g. a dithiocarbamate group, may act as a leaving group and as a polarizer during the polymerization. This embodiment is illustrated in example 12.

In embodiments, —Ar— may have a general formula selected from formula V-XI below

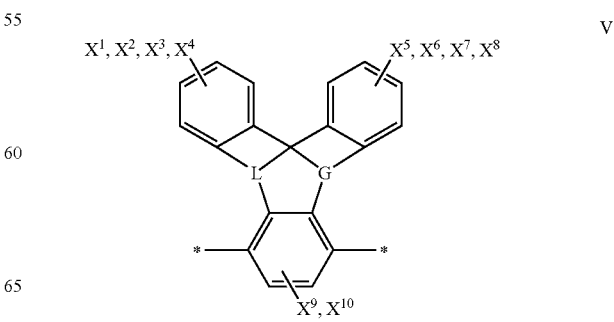

V

-continued

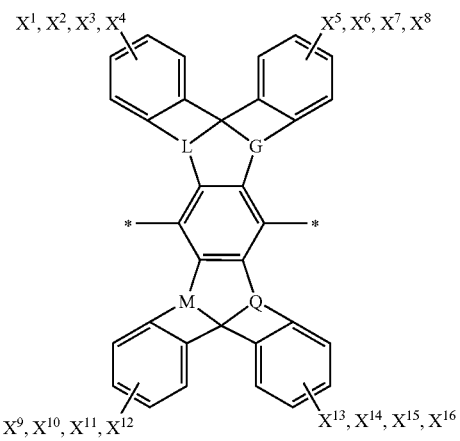

VI

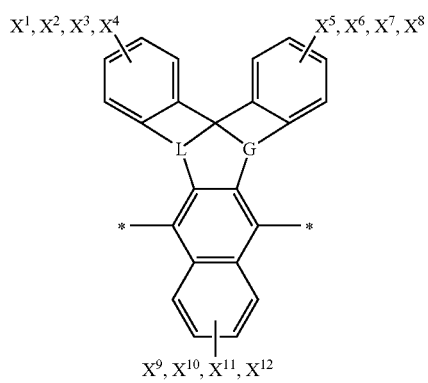

VII

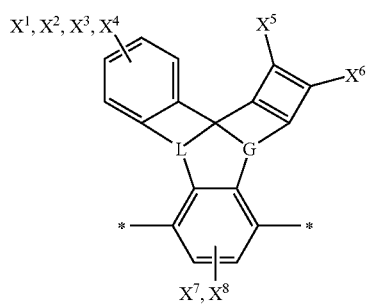

VIII

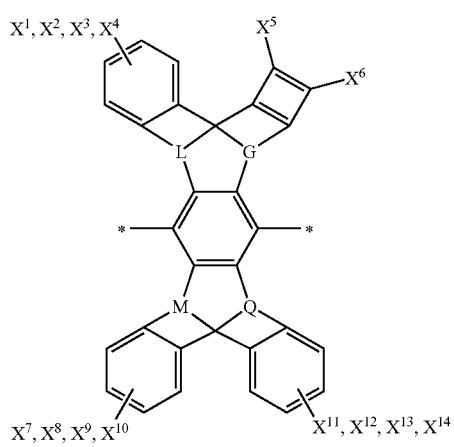

IX

-continued

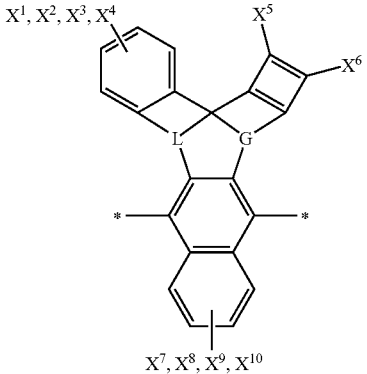

X

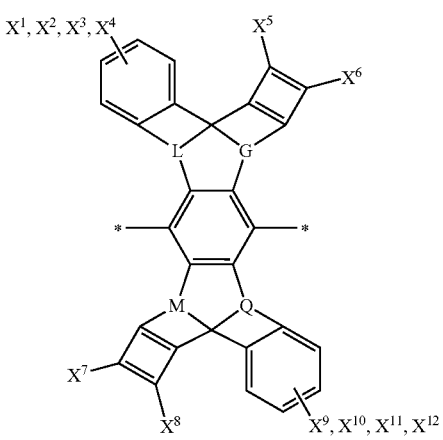

XI wherein:
each of $X^1$ to $X^{16}$ is independently selected from the group consisting of hydrogen, phenyl, benzyl, linear or branched $C_{1-22}$ alkyl (e.g. $C_{1-20}$ alkyl) and $C_{1-22}$ alkoxy (e.g. $C_{1-20}$ alkoxy) and wherein, if the main chain of said linear or branched $C_{1-22}$ alkyl (e.g. $C_{1-20}$ alkyl) or $C_{1-22}$ alkoxy (e.g. $C_{1-20}$ alkoxy) includes at least 3 carbon atoms, one or more non-adjacent CH or $CH_2$ divalent groups of said linear or branched $C_{1-20}$ alkyl and $C_{1-20}$ alkoxy may independently be replaced by O, S, C(=O), C(=O)O, OC(=O), NH, N—$C_{1-4}$ alkyl or NC(=O) and/or wherein one or more hydrogen atoms may be each independently replaced by a substituent selected from the group consisting of halogens (e.g. fluoro or chloro), aryl (e.g. $C_6$-$C_{20}$ aryl), aryloxy, COOR*, $SO_3R^*$, $OSO_3X$, CN, and $NO_2$ wherein R* is selected from the group consisting of $C_{1-20}$ alkyl, $C_{2-20}$ alkenyl and aryl, wherein X is a counterion such as e.g. $Na^+$, $K^+$ or $Li^+$; If the substituent is an alkoxy, $C_3$-$C_{20}$ alkoxy are preferred; In an embodiment, any of $X_1$-$X_{16}$ can be an oligo or poly(ethylene oxide) (PEO)
each of G, L, M and Q is independently selected from the group consisting of N, P, As and $CX^{17}$; The substituents on Ar groups may be independently linear, or cyclic, or two of these substituents may be linked together to form a cycle on the Ar group
each $X^{17}$ is independently selected from the group consisting of hydrogen, $C_{1-20}$ alkyl and $C_{1-20}$ alkoxy, wherein if the main chain of said $C_{1-20}$ alkyl or $C_{1-20}$ alkoxy includes at least 3 carbon atoms, one or more non-adjacent CH or $CH_2$ divalent groups of said $C_{1-20}$ alkyl and $C_{1-20}$ alkoxy may independently be replaced by O, S, C(=O), C(=O)O, OC(=O), NH, N—$C_{1-4}$ alkyl or NC(=O) wherein one or more hydrogen atoms may be each independently replaced by a substituent selected from the group consisting of fluoro, chloro, aryl and CN, and wherein both stars indicate points of attachment of the Ar group in the Ar-containing monomeric moiety of the general formula (I).

In an embodiment of the first aspect, the monomer may have the following general formula (III):

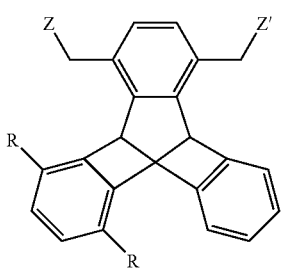

(III)

wherein R may be selected from the group consisting of hydrogen and $C_1$-$C_{12}$ alkyloxy and wherein Z and Z' may be as defined in any of the embodiments above. An example illustrating the preparation of such a monomer is given in examples 1.1-1.3. An example illustrating the polymerization of such a monomer is given in examples 1.4-1.5. The particular embodiment wherein R is H is particularly advantageous as it enable the synthesis of soluble precursor polymers that can be converted into insoluble conjugated polymers. This monomer therefore permits to deposit an insoluble conjugated iptycenylene vinylidene polymer on a substrate. This is advantageous as it permits to add a solvent-based organic layer above the conjugated iptycenylene vinylidene polymer without risking dissolving it and therefore without intermixing the solvent-based organic layer with the conjugated iptycenylene vinylidene polymer. This eases device fabrication.

In embodiments of the first aspect, the monomer may be selected from the compounds described in the following list:

1) Compound having the general formula (XXIX):

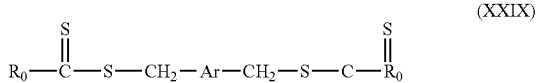

(XXIX)

wherein Ar is an iptycenylene derivative as described in any embodiment of the first aspect. For instance, each of the Ar groups may be substituted with one or more substituents independently selected from the group consisting of $C_1$-$C_{20}$-alkyl, $C_3$-$C_{20}$-alkoxy, $C_1$-$C_{20}$-alkylsulfate and salts thereof, oligo or poly(ethylene oxide) (PEO), a phenyl group or a benzyl group. The substituents on the Ar group may be independently linear, or cyclic, or two of these substituents may be linked together to form a cycle on the Ar group.

2) Compound (XX) having the general formula:

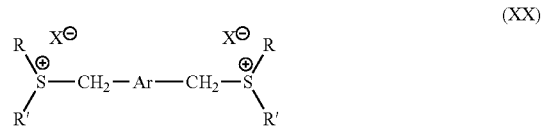

(XX)

wherein Ar is an iptycenylene derivative as described in any embodiment of the first aspect. For instance, each of the Ar groups may be substituted with one or more substituents independently selected from the group consisting of $C_1$-$C_{20}$-alkyl, $C_3$-$C_{20}$-alkoxy, $C_1$-$C_{20}$-alkylsulfate and salts thereof, oligo or poly(ethylene oxide) (PEO), a phenyl group or a benzyl group. The substituents on the Ar group may be independently linear, or cyclic, or two of these substituents may be linked together to form a cycle on the Ar group. R and R' are independently selected from the group consisting of $C_1$-$C_4$ alkyl or form together with the sulfur atom a tetrahydrothiophenium. X is a counterion such as e.g. a halogen.

In a second aspect, the preferred embodiments relate to a method for synthesizing a monomer according to the first aspect. In an embodiment, the method involves the reaction of a compound having the general formula (XXVIII) with a compound of general formula ZH or a salt thereof.

X'—CHR$_3$—Ar—CHR$_4$—X''  (XXVIII)

wherein Ar, Z, $R_3$ and $R_4$ are as defined in any embodiment of the first aspect (for instance Z can be —S—C(S)—$R_0$) and wherein each of X' and X'' is an halogen or a pseudo-halogen. This reaction can be performed by reacting about two equivalents (e.g. between 1.5 and 2.5 eq) of ZH with one equivalent of a compound (XXVIII). Preferably, this reaction is performed by reacting at least two equivalents (e.g. an excess) of ZH with one equivalent of a compound (XXVIII). For instance between 1.5 and 5 equivalents could be used. Alternatively, at least one equivalent but less than two equivalent of ZH can be used if a monosubstitution is aimed for (e.g. to retain X' and to substitute X'' by Z). In this last case, between 0.8 and 1.2 equivalents could for instance be used. The reaction is preferably performed in an appropriate solvent. For instance, the solvent can be ethanol but other solvent could be used as well. Solubility depends on the structure of the monomer and the choice of an appropriate solvent is well within the skills of the person skilled in the art. The reaction can usually be performed at room temperature. The reaction time can extend up to several days, e.g. three days. As a non-limiting example according to embodiments of the second aspect, a dithiocarbamic acid sodium salt may be added in the solid state to a compound having the general formula (XX) or to a compound having for general formula (XXV) in an organic solvent or in a mixture of organic solvents.

Y—Ar—Y  (XXV)

wherein Y may comprise chloromethyl, bromomethyl or fluoromethyl atoms and wherein Ar may be according to any embodiment of the first aspect.

After stirring a few hours at room temperature, the reaction product may be extracted with an appropriate solvent (for example ether) and dried over magnesium sulfate. The product of that reaction is an iptycene derivative wherein dithiocarbamate groups have replaced SRR' groups in formula (XX).

Compounds of the general formula (XXVIII) can for instance be synthesized according to a method as disclosed in FIG. 16 B of U.S. patent publication No. 2006/073607. The substituted triptycene or hererotriptycene basic structures as well as the pentiptycene (bistriptycene) or heteropentiptycene (heterobistriptycene) are accessible for instance via synthetic routes as listed in U.S. Pat. No. 6,605,693 columns 5 and 6.

Examples illustrating the second aspect are examples 1.3-1.4.

In a third aspect, the preferred embodiments relate to a polymer (usually referred to as a precursor polymer) having the general formula (IV):

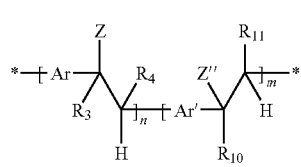
(IV)

wherein Ar is as defined in any embodiment of the first aspect, wherein Ar' is an arylene or heteroarylene optionally substituted with one or more substituents independently selected from the group consisting of $C_{1-20}$ alkyl, $C_{1-20}$ alkoxy (preferably $C_3$-$C_{20}$ alkoxy), $C_{1-20}$ alkylsulfate, poly(ethylene oxide) (PEO) or oligo(ethylene oxide), aryl (e.g. phenyl) and aryl-$C_{1-4}$ alkyl (e.g. benzyl). Ar' may for instance comprise 4 to 20 carbon atoms. Ar' may be a rigid three-dimensional group such as e.g. an iptycenylene derivative according to any embodiments of the first aspect defining Ar. In embodiments, when Ar' is a heteroarylene, it may comprise up to 4 heteroatoms independently selected from the group consisting of oxygen, sulfur, and nitrogen.

The substituents on Ar' groups may be independently linear, or cyclic, or two of these substituents may be linked together to form a cycle on the Ar' group. In a further embodiment, Ar' may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar' may be 1,4-phenylene, 2,5-thienylene, triptycenylene or pentiptycenylene. Most preferably Ar' may be an iptycenylene derivative such as triptycenylene or pentiptycenylene.

Z and Z'' may be independently selected from the group consisting of —S$^+$RR'X$^-$, —S(O)R'', —SC(S)R$_0$ and —OR$_5$. Z is preferably not S$^+$RR'X$^-$ when m is zero. In another embodiment, Z is not S$^+$RR'X$^-$ independently of m value. $R_3$, $R_4$, $R_{10}$ and $R_{11}$ are independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups, thioether group, ester group, acid carboxylic group and heterocyclic groups. $R_0$ may be as defined in any embodiment of the first aspect.

$R_5$ is preferably a $C_{1-10}$ alkyl, R and R' are independently selected from the group consisting of $C_1$-$C_4$ alkyl or form together with the sulfur atom a tetrahydrothiophenium group. X is a counterion (e.g. Cl, Br, F. and the like). R'' may be as defined in any embodiment of the first aspect and may for instance be selected from the group consisting of $C_1$-$C_{10}$ alkyl and aryl. n may be from 5 to 2000 and wherein m is from 0 to 2000.

Precursor polymers according to the third aspect are advantageous as they are soluble in common organic solvents and can therefore be processed from solution before to be converted to their less or not soluble conjugated counterpart. This eases layer stacking. A precursor polymer according to the preferred embodiments can be a homopolymer or a copolymer. If it is a homopolymer, it is a polymer comprising iptycene units. If it is a copolymer, it is either a polymer comprising two or more different kinds of iptycene units of different chemical structure or a polymer comprising both, iptycene units and other aromatic units. Although formula (IV) shows only two types of monomers, structures comprising more than two types of monomers are equally encompassed in the preferred embodiments as they are equally accessible via the method according to the fourth aspect.

Preferably, Z and Z' are independently selected from the group consisting of —S$^+$RR'X$^-$, —S(O)R'' and —SC(S)R$_0$. Substitution of Z or Z' in a precursor polymer according to formula (IV) by a nucleophile agent can be operated in order to modify the reactivity of the precursor polymer. For instance, an —OR$_5$ group can be introduced for this purpose (e.g. via a nucleophillic substitution). In embodiments of the third aspect, dithiocarbamate containing polymer molecules according to embodiments of the third aspect may be used as photoiniferters. An example of an iniferter known in the art is p-xylylene bis(N,N-diethyl dithiocarbamate). It was first synthesized in 1984 by Otsu et al. (T. Otsu, A. Kuriyama, Polym. Bull. 1984, 11, 2, 135), and was used for the living radical polymerization of styrene and methyl methacrylate. Otsu wrote an extensive review on the iniferter concept and living radical polymerization (T. Otsu, J. Polym. Sci., Part A: Polym. Chem. 2000, 38, 12, 2121). A similar method can be used in embodiments to graft polymer chains on precursor polymers according to the third aspect.

In an embodiment of the third aspect, the precursor polymer may have the general formula (XXVI):

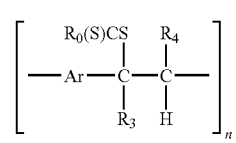
(XXVI)

wherein Ar may be as defined in any embodiments of the first aspect. $R_3$ and $R_4$ may be as defined above.

$R_0$ may be as defined in any embodiments of the first aspect. For instance, $R_0$ may be an amine —NR$_1$R$_2$, a $C_5$-$C_{20}$ alkyloxy group, an aryloxy group, an alkyl group, an aryl group, an alkylaryl group, an arylalkyl group, a thioether group, an ester group, an acid carboxylic group or a heterocyclic group. n is the number of repeating units and may be between 5 and 2000.

In a preferred embodiment, $R_0$ may be an amine —$NR_1R_2$ as illustrated herebelow,

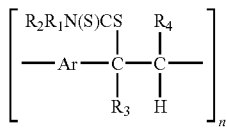

in which $R_1$ and $R_2$ are as defined in any embodiments of the first aspect. For instance, $R_1$ and $R_2$ may be independently from each other an organic group selected from the group consisting of a $C_1$-$C_{20}$-alkyl group, a cyclic $C_3$-$C_{20}$-alkyl group, an aryl group, an alkylaryl group, an arylalkyl group and a heterocyclic group, $R_1$ and $R_2$ may be linked together to form a cycle. Preferably, $R_1$ and $R_2$ may be independently selected from a methyl group, an ethyl group, a propyl group, a phenyl group and a benzyl group. The alkyl group, phenyl group and benzyl group may comprise heteroatoms and substituents. One typical example of such a precursor polymer may be a precursor polymer wherein $R_0$=—$NR_1R_2$ and wherein $R_1$=$R_2$=Et

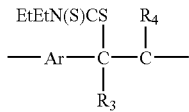

In other specific examples of precursor polymers according to embodiments of the third aspect, $R_0$ may be a phenyl group (Ph), a methyl group ($CH_3$) or a group ($F_6C_6O$). The respective repeating units are displayed herebelow:

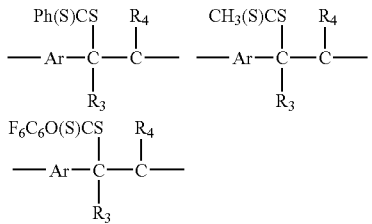

The precursor polymers, according to the preferred embodiments, may show high molecular weight (Mn, PS standard). For instance 5000 or more Dalton, preferably 7000 or more and more preferably 7500 or more. The molecular weight obtained is usually of 1000000 or less, 750000 or less, 250000 or less and most frequently 100000 or less Dalton. For instance, the molecular weight may be between 5000 and 750000, more particularly between 70000 and 250000, especially between 7500 and 100000 Dalton. The polydispersity of the precursor polymers, according to the preferred embodiments may be between 1 and 15. Usually, it is 1.5 or above, frequently it is 1.7 or above, more frequently it is 1.8 or above, most frequently it is 2 or above. Preferably it is 11 or less, more preferably 6 or less, even more preferably it is 4 or less and most preferably it is 3.5 or less. For instance, it can be between 1.5 and 4 or between 2 and 3. It is sometimes preferable to have a Mn below 2. The precursor polymer may be obtained in good overall yields in a reproducible way. Large-scale production may be a possibility. Preferably, the precursor polymer of the preferred embodiments may comprise more than 25% of Ar (iptycene derivative containing) monomeric units (as opposed to Ar' containing units when Ar' is not encompassed by the definition of Ar), preferably from 30 to 100%, more preferably from 50 to 100%, even more preferably from 70 to 100%.

Examples illustrating embodiments of the third aspect are examples 2 and 3.

In a fourth aspect, the preferred embodiments relate to a method for the preparation of polymer according to the third aspect.

In an embodiment of the fourth aspect, the method comprises the steps of:

Providing a first monomer having the general formula (I):

$$Z—CHR_3—Ar—CHR_4—Z' \quad (I)$$

i.e. a monomer according to any embodiment of the first aspect,

Optionally providing a second monomer having the general formula (XXI)

$$Z''—CHR_{10}—Ar—CHR_{11}—Z''' \quad (XXI)$$

and reacting each of said monomer with a basic compound in the presence of an organic solvent to obtain said precursor polymer, wherein Ar' is as defined in any embodiments of the third aspect or is an iptycene Ar group as defined in any embodiments of the first aspect, —Z, —Z', —Z" and —Z''' are independently selected from the group consisting of halogen, pseudo-halogen, —$S^+RR'X^-$, —S(O)R" and —SC(S)$R_0$ preferably with the proviso that —Z and —Z' are not simultaneously halogen or pseudohalogen and that —Z" and Z''' are not simultaneously halogen or pseudohalogens. R, R', X, R" and $R_0$ are as defined in any embodiments.

Chain end controlling additives are not required but can be optionally used. Chain end controlling additives are usually molecules of the general formula Ar'—Z wherein Z is as defined in any embodiments of the first aspect and Ar' is as defined in any embodiments of the third aspect.

Compounds according to the general formula (XXVII) herebelow are examples of co-monomer usable together with a monomer according to the first aspect in order to form a copolymer according to an embodiment of the fourth aspect.

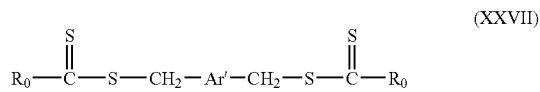

(XXVII)

In embodiments of the forth aspect, Ar' may be an aromatic or heteroaromatic divalent group as defined in any embodiments of the third aspect.

$R_0$ may be an aromatic divalent group or a heteroaromatic divalent group consisting of an amine —$NR_1R_2$, a $C_5$-$C_{20}$ alkyloxy group, an aryloxy group, an alkyl group, an aryl group, an alkylaryl group, an arylalkyl group, a thioether group, an ester group, an acid carboxylic group.

In a preferred embodiment, $R_0$ may be an amine —$NR_1R_2$, in which $R_1$ and $R_2$ are independently from each other an organic group selected from the group consisting of a C1-C20-alkyl group, a cyclic C3-C20-alkyl group, an aryl group, an alkylaryl group, an arylalkyl group and a heterocyclic group, $R_1$ and $R_2$ may be linked together to form a cycle. Preferably, $R_1$ and $R_2$ may be independently selected from a methyl group, an ethyl group, a propyl group, a phenyl group and a benzyl group. The alkyl group, phenyl group and benzyl group may comprise heteroatoms and substituents.

In an embodiment of the fourth aspect, the comonomer may have the general formula:

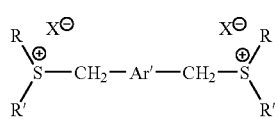 (XX)

wherein Ar' may be as defined in any embodiment of the third aspect. For instance, Ar' may be an aromatic or heteroaromatic divalent group. In a preferred embodiment, Ar' may comprise 4 to 20 carbon atoms. In another embodiment, Ar' may be a rigid three-dimensional group. In another embodiment, each of the Ar' groups may be substituted with one or more substituents independently selected from the group consisting of $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl group or a benzyl group. These Ar' groups may comprise up to 4 heteroatoms chosen from the group comprising oxygen, sulfur, and nitrogen in the aromatic cyclic system. The substituents on Ar' groups may be independently linear, or cyclic, or two of these substituents may be linked together to form a cycle on the Ar group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenanthrene-2,7-diyl; 9,10-dihydrophenantrene-2,7-diyl; dibenzofurane-2,7-diyl; dibenzothiophene-2,7-diyl. Preferably, Ar may be 1,4-phenylene, 2,5-thienylene, triptycenylene, pentiptycenylene. or iptycenylene, and most preferably Ar may be iptycenylene, triptycenylene or pentiptycenylene.

X is a counterion. For instance, it may be selected from the group consisting of Cl, Br or F.

In any embodiment of the fourth aspect, the method may involve 25% or more, preferably from 30 to 100%, more preferably from 50 to 100% of monomer having the general formula (I) and the remaining of polymer having the general formula (XXI).

In an embodiment leading to the preparation of a homopolymer having the general formula (IV) wherein m=0, said method comprises the steps of:

providing a monomer having the general formula (I):

Z—CHR$_3$—Ar—CHR$_4$—Z' (I)

and reacting said monomer with a basic compound in the presence of an organic solvent to obtain said precursor polymer wherein Ar, R$_3$, R$_4$, Z and Z' are as defined in any embodiment of the first aspect.

According to an embodiment of the fourth aspect the monomer having the general formula (I) may be reacted with a basic compound in the presence of an organic solvent to obtain the soluble precursor polymer (IV) wherein m=0. According to embodiment of the fourth aspect, no chain end controlling agents are used to obtain a soluble precursor polymer (IV). In embodiment, chain end controlling agents are not required to obtain a soluble precursor of conjugate polymers but they may be used if wished.

In embodiments of the fourth aspect, the polymerization preferably includes a step of dissolving the one or more monomers in an appropriate solvent such as e.g. THF. In the method of the preferred embodiments, it may be preferred to use an aprotic solvent. A mixture of solvents may also be used. Examples of solvents which may be used are for example amides of the general formula $R_{15}$—CONR$_{16}$H, amines of the general formula $R_{17}R_{17}$—N—$R_{18}$, sulfones of the general formula $R_{18}$—SO$_2$—$R_{19}$, sulfoxides of the general formula $R_{18}$—SO—$R_{19}$, a solvent from the group consisting of alcohols, such as for example sec-butanol and all linear or branched $C_nH_{2n+2}O$ where $1 \leq n \leq 20$, glycols, polyethers, cyclic ethers, unsaturated ethers, wherein $R_{15}$, $R_{16}$ are the same or different and denote H, a linear or branched alkyl group, or $R_{15}$ and $R_{16}$ together are —(CH$_2$)$_2$—, —(CH$_2$)$_3$—, CH$_2$—CH=CH$_2$—CH$_2$ or —(CH$_2$)$_4$—; and $R_{17}$ has the meaning of $R_{15}$ or is a phenyl group which is unsubstituted or substituted by halogen, methyl and/or methoxy groups; and $R_{18}$, $R_{19}$ are the same or different and have the meaning of $R_{17}$, except H, or $R_{18}$ and $R_{19}$ together are —(CH$_2$)$_2$—, —(CH$_2$)$_3$—, —(CH$_2$)$_4$— or —CH$_2$—CH=CH—CH$_2$—.

The concentration of starting monomer (I) may be determined by the solubility of the monomer (I). All concentration of the starting monomer (I) in a solvent may be used as long as the monomer (I) is still fully soluble. However, a concentration of between 0.05 and 0.5M, preferably between 0.1 M and 0.3 M may generally be preferred.

In a further embodiment of the fourth aspect, reacting the monomer with a basic compound may be performed at a temperature between −78° C. and 200° C., preferably between −40° C. and 120° C., and most preferably between −20° C. and 30° C. The temperature may be selected such that the average molecular weight of the soluble precursor polymer obtained is as high as possible and that the polydispersity is as low as possible. In embodiments, the reaction can be performed at room temperature or at a higher temperature such as e.g. a temperature comprised between 20° C. and the boiling point of the solvent used. For instance, the temperature can be chosen from 20° C. to 80° C. The reaction is preferably performed under inert atmosphere. For instance, the reaction may be performed in nitrogen or in argon. In embodiments of the fourth aspect, the basic compound may be a strong base such as lithium diisopropylamide (LDA) or lithium hexamethyldisilazide (LHMDS) but other bases can be used as well. The basic compound may for instance be a metal base, an ammonium base (e.g. ammonium hydroxide) or a non-charged base such as amines like for example triethylamine, pyridine and non-ionic phosphazene bases. The metal in these basic compounds may preferably be an alkali metal or an alkaline earth metal, i.e. a metal from group I or II. Classes of metal and ammonium bases are metal hydrides, such as NaH or KH, metal hydroxides, such as NaOH, LiOH or KOH, metal alkoxides, such as NaOMe or NaOEt; KotBu; metal amines such as a lithium-ammonia solution, a sodium-ammonia solution, lithium in methylamine; metal amides, such as NaNH$_2$, NaN(SiMe$_3$)$_2$, lithiumdiisopropylamide (LDA), organometal compounds wherein the metal is an alkali metal or alkaline earth metal, such as for example a $C_{1-20}$ alkyl lithium (e.g. n-BuLi) or a $C_{1-20}$ alkyl sodium, Grignard reagents, and ammonium hydroxides. Grignard reagents are organic magnesium halides preferably dissolved in a non-reactive solvent (typically dry ethyl ether). The substance is made up of an organic group, e.g. an alkyl or aryl group, joined by a highly polar covalent bond to magnesium, while the magnesium is joined by an ionic bond to a halogen ion e.g. bromide or iodide. In polar aprotic solvents it is preferred to use metal hydrides as they show substantially no nucleophillic properties. In polar protic solvents it is preferred to use bases with a pKa larger than the pKa of the solvent. In this case the solvent is deprotonated and acts as the actual basic compound.

Preferably, at least one equivalent of base is used. For instance, excess is used. In an embodiment, from 0.9 to 5 equivalents are used but higher excess of base are often usable depending on the base stability of the monomers used. Preferably, the amount of basic compound may be from 1 to 2 equivalents with respect to the starting monomer. It may be preferred to use about one equivalent of basic compound (e.g. between 0.9 and 1.1 eq) because a too high concentration of basic compound may induce an in situ conversion reaction during the polymerization.

The reaction time can range from about one hour to several hours or days. Between one and three hours is usually sufficient to form a polymer. Example 1.4 and 1.5 illustrates an example of polymerization according to embodiments of the fourth aspect.

As an example of synthesis of a comonomer, a dithiocarbamic acid sodium salt may be added in the solid state to an aromatic or heteroaromatic ring structure of the general formula of compound (XX).

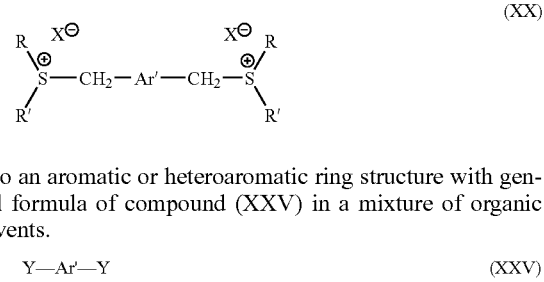

(XX)

or to an aromatic or heteroaromatic ring structure with general formula of compound (XXV) in a mixture of organic solvents.

Y—Ar'—Y    (XXV)

wherein Y may comprise chloromethyl, bromomethyl or fluoromethyl atoms and wherein Ar' may be an aromatic or heteroaromatic divalent group as defined in any embodiments of the third aspect (e.g. an iptycene derivative). In a preferred embodiment, wherein Ar' may be an aromatic or heteroaromatic divalent group. In a preferred embodiment, Ar' may comprise 4 to 20 carbon atoms. In another embodiment, Ar' may be a rigid three-dimensional group. In another embodiment, each of the Ar' groups may be substituted with one or more substituents independently selected from the group consisting of $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl group or a benzyl group. These Ar' groups may comprise up to 4 heteroatoms chosen from the group comprising oxygen, sulfur, and nitrogen in the aromatic cyclic system. The substituents on Ar' groups may be independently linear, or cyclic, or two of these substituents may be linked together to form a cycle on the Ar' group.

In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-biphenylene; phenantrene-2,7-diyl; 9,10-dihydrophenantrene-2,7-diyl; dibenzofurane-2,7-diyl; dibenzothiophene-2,7-diyl. Preferably, Ar' may be 1,4-phenylene, 2,5-thienylene, triptycenylene, pentiptycenylene.

After stirring a few hours at room temperature, the reaction product may be extracted with for example ether and dried over magnesium sulfate.

The product of that reaction is an arylene or heteroarylene group wherein dithiocarbamate groups replace Y or SRR' in formula (XXV) and (XX) respectively.

In embodiments of the fourth aspect wherein the precursor polymer is a copolymer based on two or more monomers, the precursor polymer may partly originates from (in addition to the iptycene monomer according to the first aspect) monomers typical to form poly(p-phenylene vinylene) derivatives, such as for example monomers that, if homopolymerized, would lead to alkoxy poly(p-phenylene vinylene) precursor (alkoxy-PPV precursor) such as e.g. a precursor of poly(2-methoxy,5-3',7'-dimethyloctyloxy)-1,4-phenylene vinylene (MDMO-PPV or $OC_1C_{10}PPV$). Other suitable co-monomers are for instance monomers that, if homopolymerized, would lead to a poly(p-thienylene vinylene) precursor (PTV precursor).

In a preferred embodiment, a solution of the monomer of formula (I) or a monomer of formula (I) and at least a monomer of formula (XX) at a giving temperature may be degassed for a giving time by passing through a continuous nitrogen flow. A basic compound dissolved in an organic solvent may then be added, for instance in one-go, to the stirred monomer solution. The polymer may then for instance be precipitated in ice-cold water and extracted, washed and dried.

A mixture of different starting monomers of formula (I) may be reacted by using the above method, leading to copolymers. Alternatively, a mixture of different starting monomers of formula (I) and of formula (XXI) may be polymerized by using this method leading to copolymers. In embodiments, the precursor polymers of the third aspect (whether homo- or copolymer) may then be used as polyiniferters in iniferter controlled free-radical polymerization to the synthesis of block copolymers and grafted polymers.

The precursor polymer with structural units of formula (IV) such obtained is usually fully soluble in common organic solvents such as for example THF, cyclohexanone, DMF, chloroform, DMSO, toluene, benzene, dichlorobenzene, dichloromethane, acetone, dioxane and shows an average molecular weight (Mw) between 5,000 and 1,000,000 and a polydispersity between 2 and 15 measured by gel permeation chromatography relative to polystyrene standards. Examples illustrating the fourth aspect are examples 1.4-1.5.

In a fifth aspect, the preferred embodiments relate to a conjugated polymer comprising more than 25%, preferably from 30 to 100%, more preferably from 50 to 100%, even more preferably from 70 to 100% of monomers having the general formula

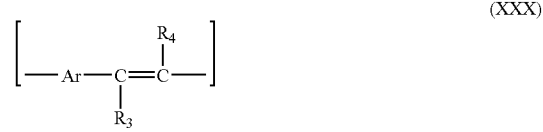

(XXX)

wherein Ar, $R_3$ and $R_4$ are as defined in any embodiments of the first aspect with the proviso that said polymer is not a homopolymer corresponding to the following formula (XIII):

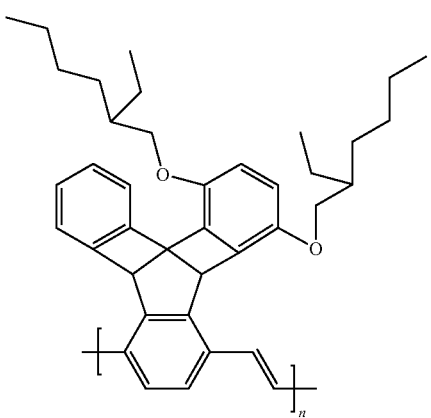

(XIII)

For instance, Ar may be selected from the group consisting of substituted and non-substituted triptycenylene (e.g. substituted and non-substituted pentiptycenylene or substituted and non-substituted iptycenylene). $R_3$ and $R_4$ for instance can be independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups and heterocyclic groups.

In an embodiment of the fifth aspect, the conjugated polymer may have the following general formula (XXIII):

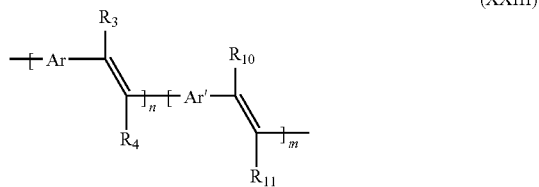

(XXIII)

wherein Ar is as described in any embodiment of the first aspect and wherein Ar', $R_3$, $R_4$, $R_{10}$ and $R_{11}$ are as described in any embodiment of the third aspect. For instance, Ar may be selected from the group consisting of substituted and non-substituted triptycenylene, substituted and non-substituted pentiptycenylene and substituted and non-substituted iptycenylene. Ar' may for instance be selected from the group consisting of arylene or heteroarylene optionally substituted with one or more substituents independently selected from the group consisting of $C_{1-20}$ alkyl, $C_{1-20}$ alkoxy, $C_{1-20}$ alkylsulfate, poly(ethylene oxide) (PEO) or oligo(ethylene oxide), poly(ethylene glycol) (PEG) or oligo(ethylene glycol), aryl and aryl-$C_{1-4}$ alkyl, wherein said heteroarylene may comprise up to 4 heteroatoms independently selected from the group consisting of oxygen, sulfur, and nitrogen. In a further embodiment, the aromatic or heteroaromatic divalent group may be selected from the group consisting of 1,4-phenylene; 2,6-naphthalenediyl; 1,4-naphthalenediyl; 1,4-anthracenediyl; 2,6-anthracenediyl; 9,10-anthracenediyl; 2,5-thienylene; 2,4-thienylene; 2,3-thienylene; 2,5-furanediyl; 2,5-pyrrolediyl; 1,3,4-oxadiazole-2,5-dyil; 1,3,4-thiadiazole-2,5-diyl; 2,5-benzo[c]thienylene; thieno[3,2-b]thiophene-2,5-diyl; pyrrolo[3,2-b]pyrrole-2,5-diyl; pyrene-2,7-diyl; 4,5,9,10-tetrahydropyrene-2,7-diyl; 4,4'-bi-phenylene; phenantrene-2,7-diyl; 9,10-dihydrophenantrene-2,7-diyl; dibenzofurane-2,7-diyl; dibenzothiophene-2,7-diyl. Preferably, Ar may be 1,4-phenylene, 2,5-thienylene or iptycenylene (e.g. triptycenylene or pentiptycenylene). Most preferably Ar may be iptycenylene, triptycenylene or pentiptycenylene. $R_3$, $R_4$, $R_{10}$ and $R_{11}$ may for instance be independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups and heterocyclic groups, wherein n is from 5 to 2000 and wherein m is from 0 to 2000 with the proviso that n/(n+m) is more than 0.25, preferably from 0.30 to 1.00, more preferably from 0.50 to 1.00, even more preferably from 0.70 to 1.00 and the proviso that when m is 0, Ar is not

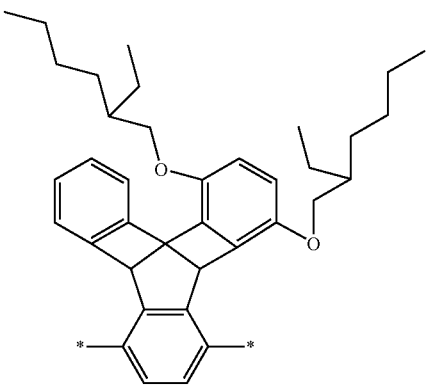 [SMILES: *c1ccc(*)c2c1C1c3ccccc3C13c1c(OCC(CC)CCCC)ccc(OCC(CC)CCCC)c1C23]

wherein both stars indicate points of attachment of the Ar group in each Ar-containing monomeric moiety in the general formula (XXIII).

In an embodiment according to the fifth aspect, the conjugated polymer may have the following formula (II):

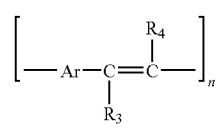

(II)

wherein Ar may be as described in any embodiment of the first aspect. For instance each of the Ar groups may be substituted with one or more substituents independently selected from the group consisting of $C_1$-$C_{20}$-alkyl, $C_3$-$C_{20}$-alkoxy, $C_1$-$C_{20}$-alkylsulfate, oligo or poly(ethylene oxide) (PEO), oligo or poly(ethylene glycol) (PEG), a phenyl group or a benzyl group. In other embodiments, these Ar groups may comprise up to 4 heteroatoms chosen from the group comprising oxygen, sulfur, and nitrogen in the aromatic cyclic system. The substituents on Ar groups may be independently linear, or cyclic, or two of these substituents may be linked together to form a cycle on the Ar group.

$R_3$ and $R_4$ may be chosen from the group comprising a hydrogen atom and a $C_1$-$C_{20}$-alkyl group, a cyclic $C_4$-$C_{20}$-alkyl group, a phenyl group and a benzyl group, which groups may comprise heteroatoms and substituents. In a preferred embodiment, $R_3$ and $R_4$ may be hydrogen.

In a specific, preferred embodiment, the conjugated arylene vinylene or heteroarylene vinylene polymer is a substituted or non-substituted derivative of the poly(iptycenylene vinylene) polymer with formula:

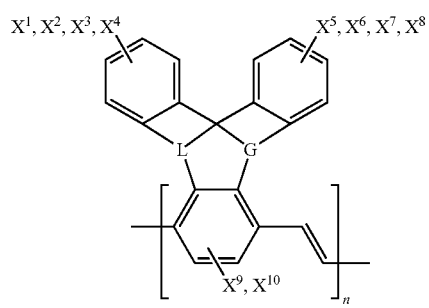
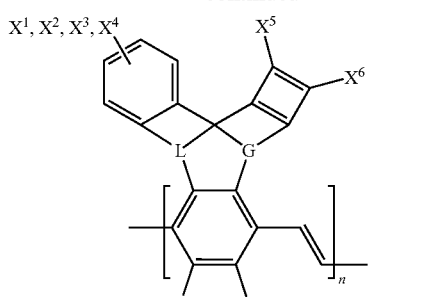
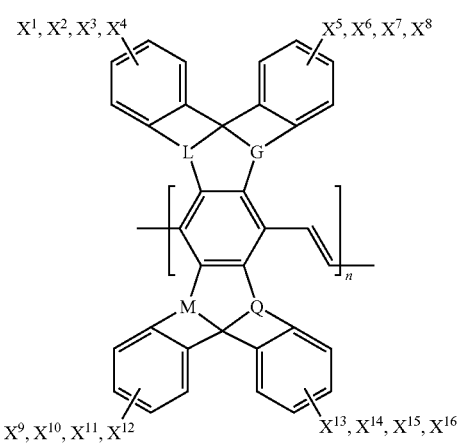
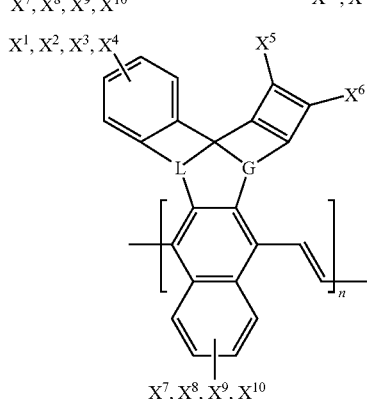
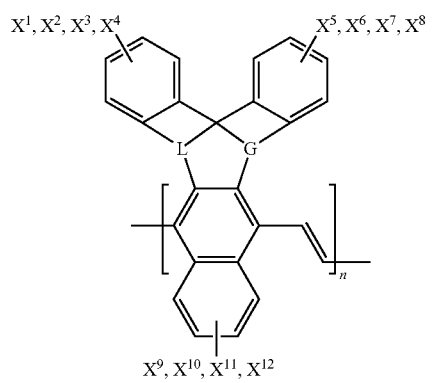
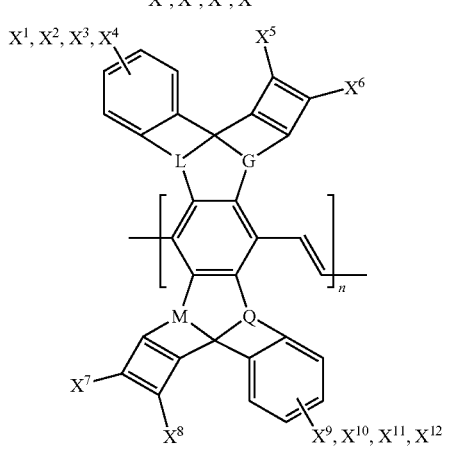
wherein L, G, M, Q, $X_1$-$X_{16}$ and n are as defined in any embodiment of the first aspect.
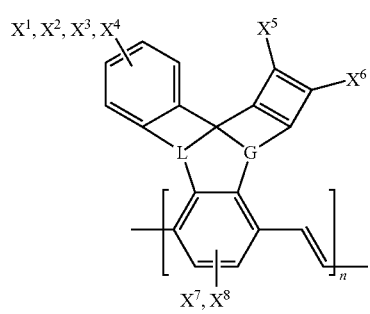
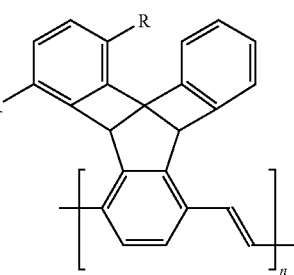
XIII

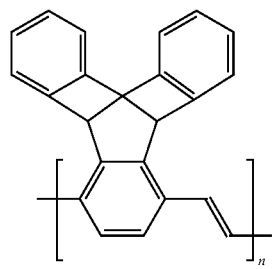

XII

R = 2-ethylhexyloxy

The average molecular weight of the poly(iptycenyl vinylene) polymer according to the preferred embodiments may be as defined for the precursor polymer of the third aspect. For instance, it may be between 5000 Dalton and 750000 Dalton, more particularly between 20000 and 500000, especially between 50000 and 250000 Dalton. The polydispersity may be as defined for the precursor polymer of the third aspect. For instance, it may be between 1 and 6, more particularly between 1.5 and 4, preferably below 2.

Due to the fact that the polymer is prepared by the method here described, the average molecular weight of the poly (iptycenyl vinylene) polymers can be easily tuned with the choice of the base use for the polymerization reaction, as for one example (XIII) can be obtained with an average weight molecular weight of 71000 Dalton when LHMDS is used as based of the polymerization reaction and 222500 Dalton when LDA is used as base of the polymerization reaction.

Due to the fact that the polymer is prepared by the method here described, the maximum absorption value of the poly (iptycenyl vinylene) polymers can be easily tuned in accordance with the choice of the iptycenylene group but also with the ratio between iptycenylene groups and other arylene groups in the polymer structure in case of a copolymer.

Furthermore, the polymer according to the preferred embodiments may be a linear polymer.

Examples illustrating the fifth aspect are examples 4 and 5.

The sixth aspect relates to a method for the preparation of a polymer according to the fifth aspect. In a first embodiment of the sixth aspect, the method is for the preparation of a polymer comprising the structural units

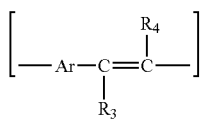

(XXX)

wherein Ar, $R_3$ and $R_4$ are as defined in any embodiments of the fifth aspect, said method comprising the steps of:
  providing at least one polymer according to the third aspect, and
    subjecting said polymer to a thermal conversion step at a temperature between 30° C. and 300° C.

Preferably, the heating step is performed while keeping the precursor polymer under inert atmosphere. In this first embodiment of the sixth aspect involving heat conversion, the precursor polymer (IV) formed in the fourth aspect, is converted into the corresponding soluble or insoluble conjugated polymer having the general formula (XXIII).

In the first embodiment of the sixth aspect, the soluble precursor polymer may be converted into the corresponding conjugated polymer with units of structural formula (XXX) in two ways:

1. by elimination of the leaving groups and formation of the vinylene double bonds by thermal heating of the precursor polymer solution under inert atmosphere or 2. by elimination of the leaving groups and formation of the vinylene double bonds by thermal heating in thin film. The thin films are prepared from the soluble precursor polymer by, for example, spin-coating, drop-casting, ink-jet printing or doctor-blading or any other film-making techniques, and converted by heating under vacuum or under inert atmosphere. The conversion in thin film is preferred when the conjugated polymer is expected to be insoluble; therefore the conversion of the soluble precursor polymer towards the conjugated polymer is made in situ in thin film.

In the first embodiment of the sixth aspect, the polymer (XXIII) may be formed by performing the conversion step of the soluble precursor polymer towards the soluble conjugated polymer in solution. The conversion in solution is only possible when the conjugated polymer is a soluble polymer. The precursor polymer (IV) may be subjected to a thermal conversion step at a temperature between 30° C. and 300° C. The conversion reaction of the precursor polymer (IV) starts around 100° C. and is completed at around 250-300° C. depending on the chemical structure of the polymer. In this embodiment, the precursor polymer (IV) may thus be dissolved in a solvent in a giving concentration, typically 0.1 M, and is degassed by passing through a continuous nitrogen flow for, for example, 1 hour. The temperature may then be increased and the inert atmosphere is maintained during the conversion reaction and the cooling down. A typical procedure comprises heating a ramp from room temperature to the conversion temperature at 2° C./min, followed by isotherm at the conversion temperature for 3 hours and cooling down to room temperature. In another embodiment, more than one cycle as described above may be applied to the polymer.

In the first embodiment of the sixth aspect, the soluble or insoluble conjugated polymer (XXIII) may also be formed by performing the conversion step in thin film. Glass substrates coated with indium tin oxide (ITO) are cleaned with isopropanol in an ultrasonic bath for 20 minutes and dried in nitrogen flow. The precursor polymer (IV) may then be coated on the glass substrate from solution. A two-step process may be used. A first step determines the film thickness and may be done with a closed cover for, for example, 5 seconds at 600 rpm. In a second step the film may be dried with an open cover for, for example, 2 minutes at 40 rpm.

The conversion of the precursor polymer (IV) towards the soluble or insoluble conjugated polymer in thin film may be done in a glove box under inert atmosphere on a hot plate from room temperature to the conversion temperature at 2° C./min followed by 10 minutes at the conversion temperature. The conversion reaction may be carried out also under vacuum conditions.

The polymer (IV) is preferably kept under inert atmosphere.

In a second embodiment of the sixth aspect, the precursor polymer (IV) formed in the fourth aspect, is converted into the corresponding soluble or insoluble conjugated polymer having the general formula (XXIII) via a method that may comprise the steps of:

providing at least one polymer having the general formula:

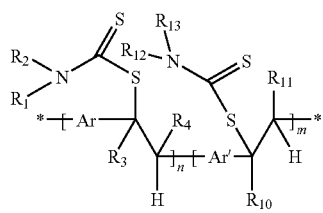

(XXII)

and, reacting said polymer with an acid.
wherein Ar is as defined in any embodiment of the first aspect. For instance, Ar may be an iptycenylene derivative selected from the group consisting of substituted and non-substituted triptycenylene, substituted and non-substituted pentiptycenylene. Ar' may be according to any embodiments of the third aspect. For instance, Ar' may be an arylene or heteroarylene optionally substituted with one or more substituents independently selected from the group consisting of $C_{1-20}$ alkyl, $C_{1-20}$ alkoxy, $C_{1-20}$ alkylsulfate, poly(ethylene oxide) (PEO) or oligo(ethylene oxide), poly(ethylene glycol) (PEG) or oligo(ethylene glycol), aryl and aryl-$C_{1-4}$ alkyl, wherein $R_3$, $R_4$, $R_{10}$ and $R_{11}$ are independently from each other hydrogen or an organic residue selected from the group consisting of a $C_1$-$C_{20}$-alkyl group, a cyclic $C_3$-$C_{20}$-alkyl group, aryl groups, alkylaryl groups, arylalkyl groups and heterocyclic groups, wherein $R_{12}$ and $R_{13}$ are either independently selected from the group consisting of $C_1$-$C_{20}$-alkyl, $C_3$-$C_{20}$-cycloalkyl, aryl, $C_{1-4}$ alkyl-aryl, aryl-$C_{1-4}$ alkyl and heterocyclyl or $R_{12}$ and $R_{13}$ are linked together to form a cycle comprising 4 to 8 carbons, wherein $R_1$ and $R_2$ are either independently selected from the group consisting of $C_1$-$C_{20}$-alkyl, $C_3$-$C_{20}$-cycloalkyl, aryl, $C_{1-4}$ alkyl-aryl, aryl-$C_{1-14}$ alkyl and heterocyclyl or $R_1$ and $R_2$ are linked together to form a cycle comprising 4 to 8 carbons, wherein R and R' are independently selected from the group consisting of $C_1$-$C_4$ alkyl or form together with the sulfur atom a tetrahydrothiophenium group, wherein R" is selected from the group consisting of $C_1$-$C_{10}$ alkyl and aryl, wherein n is from 5 to 2000 and wherein m is from 0 to 2000. The modification process according to preferred embodiments can suitably be effected in solution in one or more organic solvents. The selection of an appropriate solvent is within the ordinary skill of the skilled person and depends namely upon the solubility of the precursor polymer and/or the type (organic or inorganic) of acid used and/or the solubility of the acid used for polymer modification. Effective solvents have been found to include "non-polar solvents", "polar aprotic solvents", and "polar protic solvents" such as, but not limited to, aliphatic hydrocarbons (e.g. alkanes), heterocyclic hydrocarbons, ethers, halogenated aliphatic hydrocarbons (e.g. halomethanes), aliphatic carboxylic acid esters (e.g. alkyl acetates), ketones, nitriles, formamides, dimethyl sulfoxide, alkanoic acids (e.g. acetic acid, propanoic acid or butyric acid), alcohols, aromatic hydrocarbons and aromatic halogenated hydrocarbons, and more particularly such as, but not limited to, chlorobenzene, dichlorobenzene (all isomers thereof), trichlorobenzene, dichlorofluorobenzene (all isomers thereof), chlorodifluorobenzene (all isomers thereof), toluene, xylene and the like, and mixtures thereof in all proportions. In the case of the conversion of a polymer of general formula (XXII), the amount of acid that is suitable for performing the process according to preferred embodiments may depend upon the specific acid used but is usually from about 0.1 to about 3.0 molar equivalents of the dithiocarbamate moieties present in the polymer to be modified, e.g. between 0.5 and 2.0 molar equivalents, for instance from 1.0 to 1.5 molar equivalents of the dithiocarbamate moieties of the polymer.

The process according to embodiments of the sixth aspect involving the conversion of a precursor of general formula (XXII) can be performed over a broad range of temperatures depending namely upon parameters such as the type of solvent such as from about −30° C. to about +130° C., e.g. from about 20 to about 100° C., for instance from about 20 to about 70° C. or from about 20 to about 50° C.

According to another specific embodiment of the method according to the preferred embodiments involving the conversion of a precursor of general formula (XXII), the pKa of the acid used for polymer modification may be from about −10 to about 11, e.g. from about −3 to about 4. For instance, the pKa value can be about 4. The pKa of the main available organic and inorganic acids (usually measured at room temperature, i.e. about 25° C., in aqueous solutions) is widely available in literature (for instance in Handbook of Chemistry and Physics $81^{st}$ edition (2000), CRC Press, pages 8-44 to 8-56). In accordance with a particular embodiment, it is preferred that the pKa (measured at room temperature—about 25° C.—in aqueous solutions) of said acid used for polymer modification is lower than about 4, i.e. with exclusion of the so-called weak acids. Based on the above criteria, acids suitable for the practice of the preferred embodiments mainly include inorganic acids such as, but not limited to, hydrogen iodide, hydrogen bromide, hydrogen chloride, hydrogen fluoride, sulfuric acid, nitric acid, iodic acid, periodic acid and perchloric acid, as well as $HOClO$, $HOClO_2$ and $HOIO_3$. Some organic acids are also suitable for the practice of certain embodiments, including but not limited to:

phosphonic acids of general formula $RP(O)(OH)_2$ wherein R is a hydrocarbyl group;

sulfonic acids including optionally substituted alkylsulfonic acids and arylsulfonic acids such as, but not limited to, methanesulfonic acid, aminobenzenesulfonic acid (all 3 isomers thereof), benzenesulfonic acid, naphthalenesulfonic acid, sulfanilic acid and trifluoromethanesulfonic acid;

monocarboxylic acids including optionally substituted alkylcarboxylic mono-acids and arylalkylcarboxylic mono-acids such as, but not limited to, acetoacetic acid, barbituric acid, bromoacetic acid, bromobenzoic acid (both ortho and meta isomers thereof), chloroacetic acid, chlorobenzoic acid (all 3 isomers thereof), chlorophenoxyacetic acid (all 3 isomers thereof), chloropropionic acid (both α and β isomers thereof), cis-cinnamic acid, cyanoacetic acid, cyanobutyric acid, cyanophenoxyacetic acid (all 3 isomers thereof), cyanopropionic acid, dichloroacetic acid, dichloroacetylacetic acid, dihydroxybenzoic acid, dihydroxymalic acid, dihydroxytartaric acid, dinicotinic acid, diphenylacetic acid, fluorobenzoic acid, formic acid, furanecarboxylic acid, furoic acid, glycolic acid, hippuric acid, iodoacetic acid, iodobenzoic acid, lactic acid, lutidinic acid, mandelic acid, α-naphthoic acid, nitrobenzoic acid, nitrophenylacetic acid (all 3 isomers thereof), o-phenylbenzoic acid, thioacetic acid, thiophene-carboxylic acid, trichloroacetic acid and trihydroxybenzoic acid; and other acidic substances such as fluoro or nitro-substituted alcohols, e.g. substituted phenols as but not limited to picric acid (2,4,6-trinitrophenol), and ketones such as, but not limited to, uric acid (trihydroxy-2,6,8-purine or its ketonic form).

Acids suitable for the practice of certain embodiments also include, as an alternative embodiment, one of the above acids being generated in situ by methods available in the art. For instance this includes the so-called photo-acid generators, i.e. compounds capable of conversion into acids upon exposure to radiation, e.g. visible light sources or deep ultraviolet (UV) light sources at short wavelengths such as the range from about 100 nm to about 350 nm, or ionizing radiation such as electron-beam or X-rays. Exemplary such photo-acid generators are well known in the field of transferring images to a substrate, especially in the field of photo-resist compositions and patterning processes, and include for instance monomeric generators such as, but not limited to:

bis-sulfonyldiazomethanes, bis(cyclohexylsulfonyl)diazomethane and sulfonyldiazomethanes of U.S. Pat. No. 6,689,530;

iodonium salts and sulfonium salts (including the sulfonium salt mixtures of U.S. Pat. No. 6,638,685, especially wherein two groups of a sulfonium cation together form an oxo substituted alkylene group) wherein the anion component is selected from the group consisting of perfluoroalkylsulfonates, camphorsulfonate, benzenesulfonate, alkylbenzenesulfonates, fluorine-substituted benzenesulfonates, fluorine-substituted alkylbenzenesulfonates and halogen (provided that said anion is able to form an acid having a pKa lower than 11, and preferably lower than about 4), and/or wherein the cation component comprises one or more groups such as naphthyl, thienyl or pentafluorophenyl.

Such photo-acid generators may also include polymeric generators such as polymers with a molecular weight from about 500 to about 1,000,000 which have a sulfonium salt on their backbone and/or side chains and also have one or more organic photo-acid generating groups on side chains to generate acid by exposure to light; such polymers may be such as in preparative examples 1 and 2 of U.S. Pat. No. 6,660,479 wherein the salt may be p-toluenesulfonic salt, naphthalenesulfonic salt or 9,10-dimethoxy-2-anthracenesulfonic salt.

Two or more of the above-mentioned acids may also be suitable for the practice of the preferred embodiments, either in the form of mixtures as far as said acids may be used together under the reaction conditions (i.e. as far as their physical form allows for simultaneous reaction with the polymer to be modified) or by sequential reactions with the polymer in two or more steps.

According to an embodiment, conjugated polymers can be obtained by acid-induced elimination of dithiocarbamate moieties that act as leaving groups. Such an embodiment is particularly suitable for the preparation of a conjugated polymer or copolymer including repeating units represented by the structural formula (II):

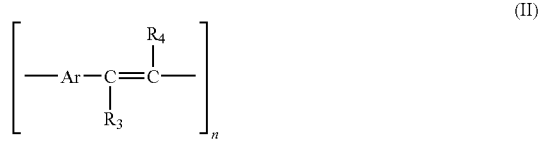

(II)

wherein Ar, $R_3$, $R_4$ and n are as defined herein above. Conjugated polymers obtained according to such an preferred embodiment show a low structural defect level and increased $\lambda_{max}$ values compared to similar conjugated polymers obtained by heat treatment at higher temperatures (usually at least 150° C.) and/or higher conversion times (usually at least 3 hours).

In any embodiment of the sixth aspect, an annealing treatment of the soluble or insoluble conjugated polymer in thin film may be carried out at a temperature of between 30° C. and 200° C. during 1 minute to 2 hours under vacuum or inert atmosphere in order to remove stresses of the polymer chains introduced during the deposition of the thin film layer and in order to induce a relaxation of the conjugated polymer chains and to change the conjugated polymer film morphology. No changes occur in the chemical structure of the conjugated polymer during this annealing treatment (heat treatment on conjugated polymer), in contrary to the conversion reaction (heat treatment on precursor polymer) which involves, under heating, an elimination of the leaving groups of the soluble precursor polymer with the formation of vinylene double bonds. This annealing treatment may be carried out before or after the electrode deposition on top of the active conjugated polymer layer.

According to any embodiments of the sixth aspect, the conversion of the precursor polymer (IV) may be performed until substantially all leaving groups are eliminated. However, a conjugated polymer may not be fully, i.e. 100%, conjugated because there can always be structural defects which can lead to about 2 to 8%, in most cases between 2 to 5%, of the resulting polymer that has not been conjugated. Therefore, in accordance with the preferred embodiments a reference to a conjugated polymer may include within its scope a deviation from complete conjugation of about 2 to 5%.

In particular embodiments of the first and second embodiment of the sixth aspect, the conversion of the precursor polymer may only be performed partially. Hence, in the resulting partially converted conjugated polymer, there may still be leaving groups present. The percentage of remaining leaving groups within the resulting conjugated polymer may be tuned by changing the experimental conditions such as, for example, temperature, conversion time, and/or atmosphere. The amount of remaining leaving groups may be between 0 and 10%. For example, if the percentage of the remaining leaving groups is 5%, it means that there are, in the resulting partially converted conjugated polymer, for 100 monomer units 5 monomer units still having a leaving group and 95 monomer units not having a leaving group. During the conversion step, the leaving groups of the precursor polymers are eliminated and double bonds of the conjugated polymer are formed. In one embodiment according to the preferred embodiments, substantially all of the leaving groups are eliminated, thus forming a fully converted conjugated polymer. However, in another embodiment according to the preferred embodiments, only between 90 and 100% of the leaving groups may be eliminated. Hence, between 0 and 10% of the leaving groups is still present in the resulting conjugated polymer. Thus, the resulting polymer is only partially converted. This polymer will be referred to as partially converted conjugated polymer. The amount of remaining leaving groups in the partially converted conjugated polymer may be controlled by changing the experimental circumstances of the conversion reaction.

In any embodiments of the sixth aspect, the duration of the subjecting (conversion) step may be lower than 24 hours, lower than 8 hours and preferably lower than 3 hours.

The conjugated arylene or heteroarylene vinylene polymers may be obtained by thermal (or in the second embodiment, acid) conversion of the precursor polymer in which the remaining Z or Z" groups (e.g. dithiocarbamate group) acts as a leaving group (or evaporating group). The conjugated polymer may show a low structural defect level.

In any embodiment of the sixth aspect the precursor polymer may be dissolved in an organic or non-organic solvent and the conversion reaction or elimination reaction may be performed in solution (e.g. by thermal treatment) under inert or controlled atmosphere to lead to a soluble or insoluble conjugated polymer. This method may in general be used when the conjugated polymer is expected to be soluble in organic and/or non-organic solvents. In a further embodiment according this sixth aspect the precursor polymer may be in the form of a thin film precursor polymer layer and the conversion or elimination reaction step may be performed under inert or controlled atmosphere or under vacuum (e.g. by in situ thermal treatment, or in the second embodiment by acid treatment).

In any embodiment of the sixth aspect, the precursor polymer may be dissolved in a common organic solvent (such as specified above), followed by a degassing step.

In the first embodiment of the sixth aspect, and depending upon the presence and type (especially chemical class and boiling point) of organic solvent, the thermal conversion step may be performed at a temperature above 30° C. or above 80° C., or above 110° C. The thermal conversion step may be performed at a temperature below 300° C., or below 250° C., or below 200° C. The thermal conversion step may be performed at constant temperature or at gradually changing temperatures, according to a specific temperature/time profile.

An illustration of this aspect is the embodiment presented in examples 1.6 and 7-11 of the preferred embodiments.

In a seventh aspect, the preferred embodiments relate to an opto-electronic device comprising at least a layer (preferably a thin layer having e.g. from 20 to 500 nm) of a polymer according to any embodiments of the third or the fifth aspect. In embodiments of the seventh aspect, an electronic device comprising a polymer according to formula (XXIII) is disclosed. An aspect is the electronic device made from the precursor polymer followed by its conversion reaction towards the conjugated polymer as pristine material or in blend.

The device (e.g. an electronic device) according to the seventh aspect is advantageous among others due to the lesser number of structural defects when compared with conjugated polymers obtained via other methods. As a result, the polymers have better properties, resulting in better electronic devices.

Such devices (e.g. integrated circuits) have the advantage of having a lower cost price than corresponding inorganic devices.

The devices may be, but are not limited hereto, for example organic field effect transistors, circuits, electroluminescent devices, organic solar cells or sensors. In a further embodiment of the seventh aspect, the device may be organic sensors such as a chemical sensor or a biological sensor. The rigid three-dimensional iptycene units can be interesting electron donor which can induce a porous structure in the bulk conjugated polymer. The conjugated polymers according to embodiments of the fifth aspect exhibit a drastic reduction in fluorescence when an electrostatic interaction occurs in presence of some specific analyte, such as for example but not limited to electron deficient nitroaromatic vapors or other RDX or other explosive tracers (e.g. TNT or DNT). Therefore those polymer materials are of interest for sensor applications. This principle is illustrated in example 6.

In any embodiments of the seventh embodiment, the precursor polymers with leaving groups (e.g. dithiocarbamate) are compatible with a device application. The lifetime of the device is not influenced by remaining traces of leaving groups in the active layer after the conversion reaction.

In an eighth aspect, a method for manufacturing an electronic device is disclosed. The electronic device comprises a polymer layer. In the method according to the preferred embodiments, a layer comprising the soluble precursor polymer (IV) is deposited. In a next step, the conjugated polymer (XXIII) layer is obtained by carrying out the conversion reaction of the coated soluble precursor polymer layer towards the active soluble or insoluble conjugated polymer by elimination of the leaving groups and formation of the vinylene doubled bonds induced by e.g. heat treatment.

In the eighth aspect, the preferred embodiments relate to the manufacturing of a device according to any embodiment of the seventh aspect.

During the manufacturing of an opto-electronic device according to the preferred embodiments, a precursor polymer (IV) according to any embodiment may be deposited and subsequently subjected to a thermal conversion step (according to the first embodiment of the sixth aspect) or to an acid conversion step (according to the second embodiment of the sixth aspect) such that an active layer may be formed.

In an embodiment of the eight aspect, the preferred embodiments further relate to a method of manufacturing bilayer heterojunction organic solar cells using a soluble precursor polymer according to any embodiments of the third aspect. The layer made from the soluble precursor polymer may become effectively active only after conversion reaction towards the related soluble or insoluble conjugated polymer by an elimination reaction (e.g. under heat treatment) in situ in thin film.

This embodiment of the eighth aspect is advantageous over prior art methods, where the conjugated polymer is the starting compound and hence must be soluble in common organic solvents (as defined above) to be mixed with e.g. a soluble $C_{60}$ derivative (for example PCBM in case of organic solar cells application). Since thermal conversion of the precursor polymer of formula (IV) starts at a relatively low temperature (e.g. about 100-115° C.), it is possible to prepare a blend n-type/p-type, used as active layer, by mixing the precursor polymer (IV) with PCBM and then carrying out the conversion reaction by heat treatment of a thin film whilst keeping the initial chemical structure of PCBM and simultaneously converting the soluble precursor polymer to the soluble or insoluble conjugated polymer. Furthermore, any other p-type material being a small molecule or an oligomer or a polymer other than $C_{60}$ or PCBM and having a chemical structure stable at the temperature used during the conversion reaction of the precursor polymer towards the conjugated polymer may be also considered.

The preferred embodiments further relate to a method of manufacturing organic transistors or sensors using a precursor polymer according to any embodiment of the third aspect. The active layer made from a soluble precursor polymer may become effectively active only after a conversion reaction towards a soluble or insoluble conjugated polymer by eliminating leaving groups and forming vinylene double bonds, e.g. by heat treatment.

Onto the active soluble or insoluble conjugated polymer layer, a further annealing treatment may be carried out in order to remove stresses of the polymer chains induced during deposition of the thin film layer and in order to induce a relaxation of the polymer chains and changes in the polymer film morphology. The annealing treatment may be carried out at a temperature of from 50 to 200° C., preferably around 100° C. (e.g. from 80 to 130° C.) This annealing treatment may be carried out before or after the electrode deposition on top of the active conjugated polymer layer.

An illustration of this aspect is the embodiment presented in example 6 of the preferred embodiments.

Example 1

Synthesis Method Towards a Precursor Polymer and its Conjugated Form Containing triptycene as "Ar" Group For trypticene compounds represented by the structural formulae (XIV), (XVI) and (XVIII), R is hydrogen. For trypticene compounds represented by the structural formulae (XV), (XVII) and (XIX), R is 2-ethylhexyloxy.

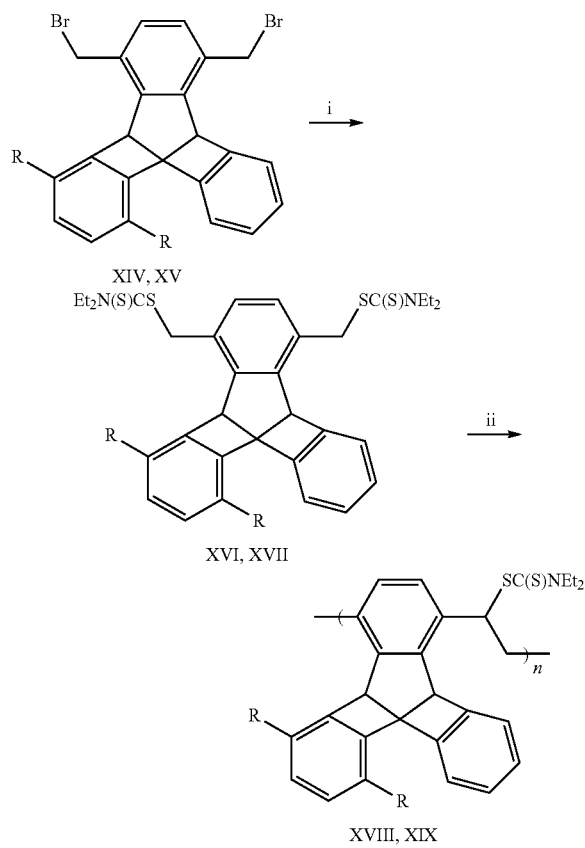

Example 1.1

1,4-bis-bromomethyltriptycene (XIV) and the Analog Compound (XV)

The compounds have been synthesized according to the procedure described in FIG. 16 B of U.S. patent publication No. 2006/073607; Compound (XIV) has been characterized as follows:

$^1$H NMR (CDCl$_3$): chemical shifts at 7.45 ppm (q, 4H), 7.03 ppm (m, 4H), 6.89 ppm (s, 2H), 5.83 ppm (s, 2H) and 4.66 ppm (s, 4H); and MS (EI, m/e): 440 (M$^+$), 360 (M$^+$-Br), 280 (M$^+$-2×Br), 266 (M$^+$-CH$_2$Br$_2$), 252 (M$^+$-2×CH$_2$Br).

Compound (XV) has been characterized as follows:

$^1$H NMR (CDCl$_3$): chemical shifts at 7.52 ppm (q, 2H), 7.07 ppm (m, 2H), 6.93 ppm (s, 2H), 6.52 ppm (s, 2H), 6.30 ppm (s, 2H), 4.89 ppm (d, 2H), 4.53 ppm (d, 2H), 3.89 ppm (m, 4H), 1.91 ppm (m, 2H), 1.65-1.21 ppm (m, 16H) and 1.04 ppm (m, 12H);

MS (EI, m/e): 696 (M$^+$), 584 (M$^+$-C$_8$H$_{17}$), 504 (M$^+$-C$_8$H$_{17}$Br), 392 (M$^+$-C$_{16}$H$_{34}$Br), 312 (M$^+$-C$_{16}$H$_{34}$Br$_2$), 298 (M$^+$-C$_{17}$H$_{36}$Br$_2$), 284 (M$^+$-C$_{18}$H$_{38}$Br$_2$), 268 (M$^+$-C$_{18}$H$_{38}$OBr$_2$), 252 (M$^+$-C$_{18}$H$_{38}$O$_2$Br$_2$).

Example 1.2

Triptycene-1,4-diylbismethylene N,N-diethyl dithiocarbamate (XVI)

A mixture of 1,4-bis-bromomethyltriptycene (XIV) (0.70 g, 1.6 mmol) and sodium diethyldithiocarbamate trihydrate (0.82 g, 3.7 mmol) in 40 mL of ethanol was stirred for three days at room temperature. Subsequently, water (30 mL) was added and the mixture was extracted with CHCl$_3$ (3×50 mL) and dried over MgSO$_4$. The crude reaction mixture was purified by column chromatography (silica, n-hexane/CHCl$_3$ 1/1) after which the dithiocarbamate-containing tryticene monomer (XVI) was recrystallized in ethanol, obtained as a white solid (0.44 g, 48% yield) which has been characterized as follows:

$^1$H NMR (CDCl$_3$): chemical shifts at 7.37 ppm (q, 4H), 6.96 ppm (q, 4H), 6.92 ppm (s, 2H), 5.78 ppm (s, 2H), 4.69 ppm (s, 4H), 4.09 ppm (q, J=7.2 Hz, 4H), 3.70 ppm (q, J=7.2 Hz, 4H), and 1.29 ppm (2t, J=7.2 Hz, 12H);

$^{13}$C NMR (CDCl$_3$): 194.79, 145.57, 144.82, 129.14, 126.97, 125.07, 123.71, 50.21, 49.42, 46.66, 40.16, 12.42, and 11.60;

DIP MS (EI, m/e): 576 (M$^+$), 428 (M$^+$-SC(S)NEt$_2$), 280 (M$^+$-2×SC(S)NEt$_2$), 148 (SC(S)NEt$_2$), 116, (C(S)NEt$_2$).

Example 1.3

5,8-Bis(2-ethylhexyloxy)triptycene-1,4-diylbismethylene N,N diethyl dithiocarbamate (XVII)

Compound (XVII) was produced by analogy to compound (XVI), but starting from compound (XV) (0.88 g, 1.26 mmol) and sodium diethyldithio-carbamate trihydrate (0.65 g, 2.89 mmol). After recrystallization in ethanol, compound (XVII) was obtained as a white solid (0.63 g, 55% yield) and has been characterized by nuclear magnetic resonance as follows:

$^1$H NMR (CDCl$_3$): chemical shifts at 7.37 ppm (m, 2H), 6.97 ppm (s, 2H), 6.94 ppm (m, 2H), 6.46 ppm (s, 2H), 6.20 ppm (s, 2H), 4.83 ppm (d, 2H), 4.53 ppm (d, 2H), 4.03 ppm (m, 4H), 3.52-3.94 ppm (m, 8H), 1.80 ppm (m, 2H), 1.38-1.65 ppm (m, 16H), 1.27 ppm (2t, 12H), and 0.95-1.07 ppm (m, 12H);

Example 1.4

Precursor Polymers (XVIII)

A solution of the dithiocarbamate-containing trypticene monomer (XVI) (400 mg, 0.694 mmol) in dry THF (3.47 mL, 0.2 M) at room temperature or 65° C. was degassed for 15 minutes by passing through a continuous stream of N$_2$ after which a strong base, lithium diisopropylamide (LDA) (347 µL of a 2 M solution in THF/n-heptane) or lithium hexamethyldisilazide (LHMDS) (764 µl/3060 µl of a 1M solution in THF) was added in one portion. The mixture was kept at room temperature, 30° C. or 65° C. for 90 minutes. The reaction mixture was quenched in ice water (100 mL), and neutralized with HCl (1M in H$_2$O). Subsequently, the aqueous phase was extracted with CH$_2$Cl$_2$ (3×60 mL). The organic layers were combined and the solvents were removed by evaporation under reduced pressure. The resulting crude polymer was re-dissolved in CHCl$_3$ (2 mL) and precipitated in MeOH (100 mL) at 0° C. The polymer was collected and dried in vacuo. A white solid was obtained (180 mg, yield 61% with respect to LDA (entry 3 of example 2)). For the yield in other conditions, see example 2. The white solid obtained was characterized by nuclear magnetic resonance as follows:

$^1$H NMR (CDCl$_3$): chemical shifts at 6.4-7.8 ppm (br m, 10H), 5.9-6.4 ppm (br s, 2H), 5.6-5.9 ppm (br s, 1H), 4.0-4.3 ppm (br s, 2H), 3.7-4.0 ppm (br s, 2H), 3.2-3.7 ppm (br s, 2H), and 0.8-1.4 ppm (2 br s, 6H).

the respective conjugated polymers. The conversion reaction is followed by means of in-situ UV-Vis and FTIR spectroscopies.

Example 2

Specifications for Polymer XVIII

| Entry | Base | Polymerization temperature | Yield (%) | $M_n$ (×10$^3$) | $M_w$ (×10$^3$) | PD |
|---|---|---|---|---|---|---|
| 1* | LDA, 1.0 eq | Room temp. | 60 | 142.4, 1.4$^a$ | 287.9, 2.1$^a$ | 2.0, 1.4$^a$ |
| 2 | LDA, 1.0 eq | Room temp. | 60 | 62.8, 1.6$^a$ | 145.1, 2.2$^a$ | 2.3, 1.4$^a$ |
| 3 | LDA, 1.0 eq | Room temp. | 61 | 51.1, 1.7$^a$ | 145.6, 2.3$^a$ | 2.8, 1.4$^a$ |
| 4 | LDA, 1.0 eq | 65° C. | 62 | 32.0, 1.6$^a$ | 71.8, 3.7$^a$ | 2.2, 2.4$^a$ |
| 5 | LHMDS, 1.1 eq | 30° C. | 75 | 36.7 | 408.7 | 11.1 |
| 6 | LHMDS, 4.0 eq | 30° C. | 85 | 55.4 | 506.7 | 9.1 |
| 7 | LHMDS, 4.0 eq | 30° C. | 83 | 103.7 | 502.7 | 4.8 |
| 8 | LHMDS, 1.1 eq | 65° C. | 73 | 28.4 | 159.0 | 5.6 |

*Entry 1 was prepared from a different batch of polymer.
$^a$bimodal distribution

Example 3

Specifications for Polymer XIX

| Entry | Base | Polymerization temperature | Yield (%) | $M_n$ (×10$^3$) | $M_w$ (×10$^3$) | PD |
|---|---|---|---|---|---|---|
| 1 | LDA, 1.0 eq | Room temp. | 49 | 33.2, 1.7$^a$ | 60.6, 2.4$^a$ | 1.8, 1.4$^a$ |
| 2 | LDA, 1.0 eq | Room temp. | 57 | 29.4, 2.3$^a$ | 67.6, 2.6$^{a*}$ | 2.3, 1.1$^a$ |
| 2bis | LDA, 1.0 eq | Room temp. | 60 | 94 | 222.5 | 2.4 |
| 3 | LHMDS, 1.1 eq | Room temp. | 91$^b$ | 10.6 | 21.5 | 2.0 |
| 3bis | LHMDS, 1.1 eq | Room temp. | 90$^b$ | 20.5 | 70.6 | 3.4 |
| 4 | LHMDS, 1.1 eq | Room temp. | 89$^b$ | 11.6 | 21.4 | 1.8 |

$^a$Bimodal molecular weight distribution
$^b$monomer left in the badge
bis: monomer batch more pure

Example 1.5

Precursor Polymer (XIX)

Polymer (XIX) was obtained by analogy to polymer (XVIII) but starting from compound (XVII) (400 mg, 0.481 mmol) and LDA (240 μL of a 2 M solution in THF/n-heptane) or LHMDS (481 μL of a 1M solution in THF). A light yellow solid was obtained (187 mg, yield 57% for the case of entry 2 in example 3) which characterized by nuclear magnetic resonance as follows:

$^1$H NMR (CDCl$_3$): chemical shifts at 5.8-7.8 ppm (br m, 10+2+1H), 3.0-4.4 ppm (br m, 4+4H), and 0.3-2.2 ppm (br m, 30+6H).

Example 1.6

Conjugated Polymers (XII, XIII)

Each precursor polymers (XVIII) and (XIX) were spin-coated from a CHCl$_3$ solution (10 mg/mL) onto NaCl disks at 500 rpm or quartz disks at 700 rpm respectively and the disks were placed in a thermo-cell. A dynamic heating rate of 2° C./min up to 350° C. under a continuous flow of N$_2$ was used for the conversion process of the precursor polymers towards

Example 4

Optical Characterization of Polymer XII

Absorption, excitation spectra (λem=470 nm) and emission spectra (λexc=380 nm) of polymer XII in spin-cast film are shown in FIG. 1.

Example 5

Optical Characterization of Polymer XIII

Figure 2:
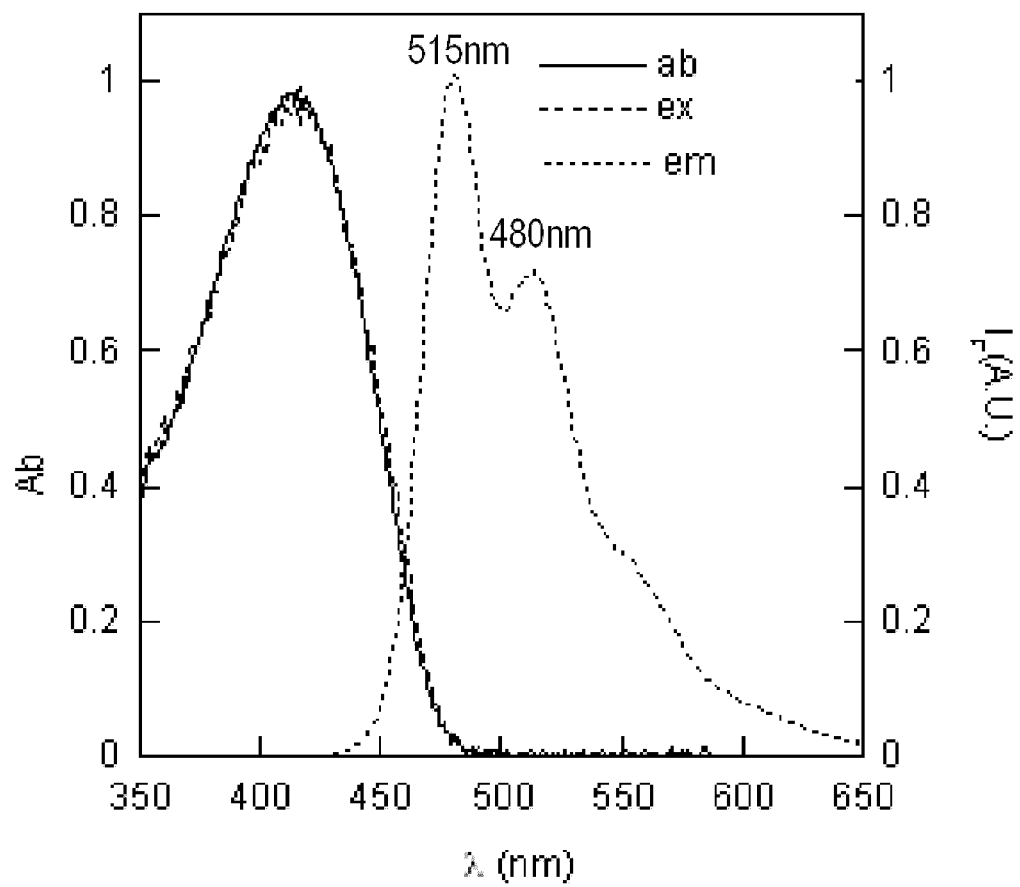
FIG. 2 is the absorption (ab), excitation (ex) and emission (em) spectra of a polymer according to an embodiment in spin-cast film.

Absorption, excitation spectra (λem=510 nm) and emission spectra (λexc=410 nm) of XIII in spin-cast film are shown in FIG. 2

Example 6

Fluorescence Quenching Experiments

Fluorescence quenching experiments were performed by connecting a detection module to a 0.02 m$^3$ glass chamber containing 2,4- and 2,6-DNT enriched air via a short (<10 cm)

length of Teflon tubing. The concentration of the nitroaromatic analytes within the chamber was 16 ppb of 2,4-DNT and 69 ppb 2,6 DNT, as determined by GC-MS. In a typical experiment, the fluorescence response of the polymer (XIII) was monitored while the DNT-enriched was drawn through the gas flow cell at a flow rate of 100 mL/min using an oil-free air pump (FL-1001, FLEC). In the experiment, the power density incident on the window of the gas flow cell was <0.4 µW/cm$^2$. Emission from the polymer thin film was passed through a 435 nm longpass filter (XF 3088, Omega Optical) to remove residual excitation light, and then focused via second Fresnel lens onto the active area of a PMT detector (H7468, Hamamatsu). Control of the PMT detector and display and logging of data was carried out via a custom LabVIEW VI.

Figure 3:
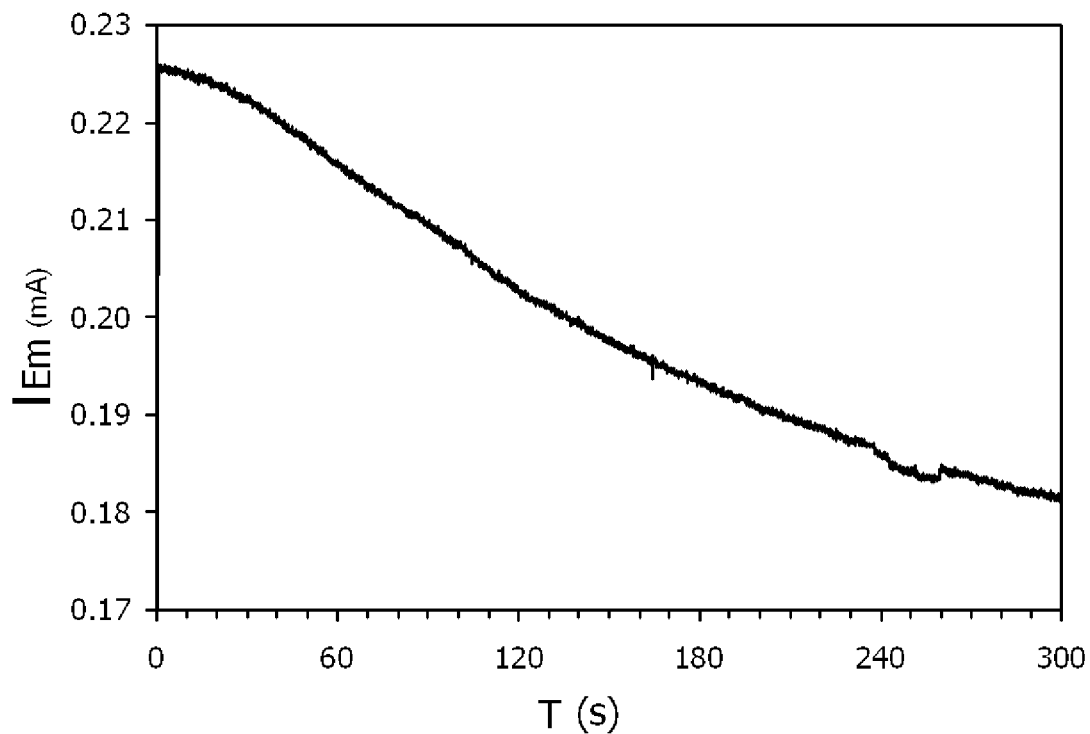
FIG. 3 is a graph showing the time (T) dependence of the fluorescence intensity ($I_{EM}$) of a thin film according to an embodiment upon exposure to an analyte.
Figure 3:
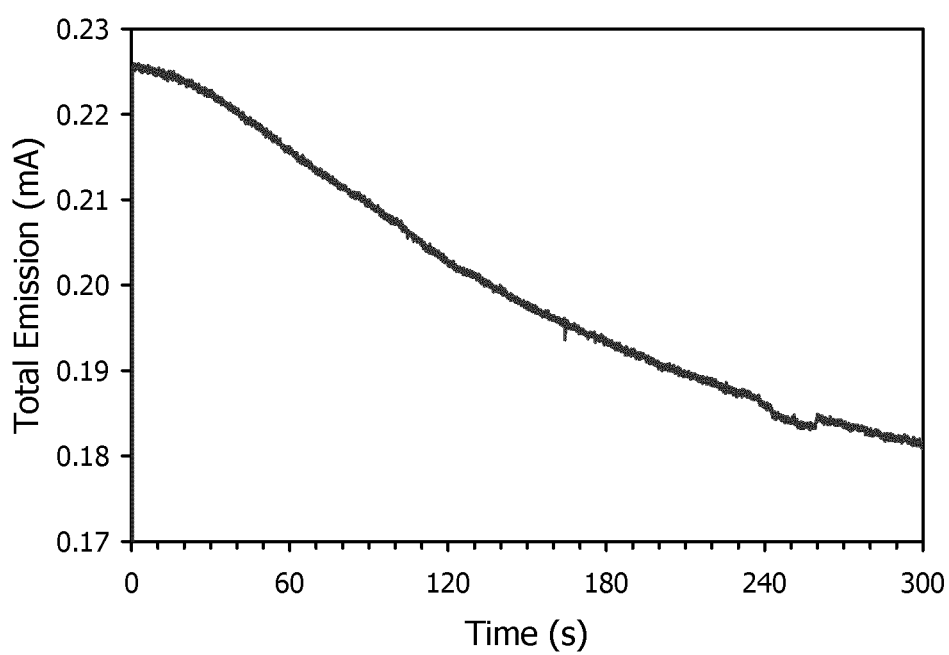

The sensitivity of the polymer films for the detection of nitroaromatic analytes was determined using the fluorescence detection module described previously. FIG. 3 shows the fluorescence intensity (total emission current $I_{EM}$ in mA) of a fresh film of (XIII) following exposure to DNT-enriched air (total DNT concentration: 85 ppb) at a flow rate of 100 mL/min. Exposure to the nitroaromatic analytes results in a steady decrease in the fluorescence intensity of the thin film over time (T), with a 10% quenching after 120 s and a total quenching of 20% observed after 5 minutes. See FIG. 3.

Example 7

Conversion of a Dithiocarbamate-Containing poly(iptycene vinylene) Precursor Polymer Derivative with Benzenesulfonic Acid at 70° C.

To a solution of 100 mg of a precursor polymer with dithiocarbamate moieties (XIX), Mw=66,500; Mn=12,800; polydispersity index=5.2 dissolved in chlorobenzene (5 ml), benzenesulfonic acid (1.5 molar equivalents based on the amount of dithiocarbamate moieties in the precursor polymer) was added as a solid. The solution was heated at 70° C. under $N_2$. The color of the solution turned from light yellow to orange yellow immediately after addition of the acid. It took more then 4 hours before the solution became fluorescent yellow what is an indication that an amount of precursor polymer is being converted into the conjugated form. Samples were taken from the reaction mixture at different points in time (after 10 minutes; 30 minutes; 1 hour; 2 hours, 4 hours, 24 hours and 48 hours, respectively) and worked up as follows. The excess of acid was neutralized with $NaHCO_3$ and then an extraction with chloroform was carried out. After evaporation of the solvent, UV-Visible spectra (in film) were taken at room temperature for each sample. Curves c, d and e of FIG. 1 are the UV-Visible spectra taken after 1, 24 and 48 hours of conversion respectively. A peak at 360 nm appears gradually over time indicating conversion to the conjugated polymer into a diethylhexyloxy-substituted poly(triptycenylene-vinylene) derivative represented by the structural formula (XIII)

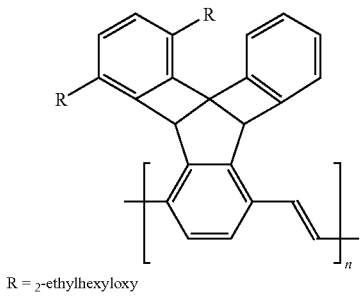

R = 2-ethylhexyloxy

Example 8

Conversion of a Dithiocarbamate-Containing Unsubstituted poly(triptycenylene vinylene) Precursor Polymer with Benzenesulfonic Acid The same experimental procedure of example 10 is repeated, except for using a dithiocarbamate-containing precursor polymer represented by the structural formula (I) wherein Ar=unsubstituted triptycenyl, $R_1=R_2=C_2H_5$, and $R_3=R_4=H$. Conversion into a poly(triptycenylene vinylene) derivative represented by the structural formula (XII) is observed.

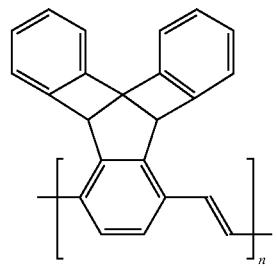

Example 9

Conversion of a Dithiocarbamate-Containing poly(iptycene vinylene) Precursor Polymer with Trifluoroacetic Acid at 70° C.

To a solution of 100 mg of poly(iptycene vinylene) precursor polymer derivative with dithiocarbamate moieties (XIX, corresponding to the structural formula (XXII) wherein Ar=1,4-bis(2-ethylhexyloxy)-9,10-dihydro-9,10[1',2']-benzoanthracene, $R_1=R_2=C_2H_5$, $R_3=R_4=H$, m=0, Mw=66,500; Mn=12,800; polydispersity index=5.2) dissolved in chlorobenzene (5 ml), trifluoroacetic acid (1.5 molar equivalent based on the amount of dithiocarbamate moieties in the precursor polymer) was added in one go as a liquid. The solution was heated at 70° C. under $N_2$. No conversion took place after 5 hours, but a longer conversion time is necessary. Samples were taken from the reaction mixture at different points in time (after 1 hour and 5 hours respectively). After evaporation of the solvent, UV-Visible spectra (in film) were taken at room temperature for each sample. Curves a and b of FIG. 1 are the UV-Visible spectra taken after 1 and 5 hours of conversion respectively.

Example 10

Modification of a Dithiocarbamate-Containing poly(triptycenylene-vinylene) Precursor Polymer with Benzenesulfonic Acid Followed by the Addition of a Biotin Derivative Such as biotin-PEO2-PPO2-amine or Biotin ethylene-diamine 5 molar equivalents of a biotin based derivative as described in example 26 is added to a mixture of the precursor polymer of example 1 and benzenesulfonic acid (1.5 molar equivalent, based on dithiocarbamate moieties) in chlorobenzene. Substitution of the dithiocarbamate groups by the biotin moiety via the terminal —NH$_2$ function onto the precursor polymer backbone occurs, as evidenced by FT-IR and NMR spectra.

Example 11

Modification of a Dithiocarbamate-Containing poly(triptycenylene vinylene) Precursor Polymer with Benzenesulfonic Acid Followed by the Addition of a Maleimide Derivative Such as 6-maleimidocaproic acid or 4-maleimidobutanoic acid 5 molar equivalents of a maleimide based derivative as described in example 29 are added to a mixture of the precursor polymer of example 1 and benzenesulfonic acid (1.5 molar equivalents, based on dithiocarbamate moieties) in chlorobenzene. Substitution of the dithiocarbamate moieties by the maleimide based derivative via the terminal carboxylic acid group onto the precursor polymer backbone occurs.

Example 12

Synthesis of a Precursor Co-Polymer Comprising iptycenylene and Phenylene Monomeric Units A monomer 1-bromomethyl-4-(n-octhylsulfoxymethyl)-9,10-dihydro-9,10-o-benzenoanthracene of the following formula:

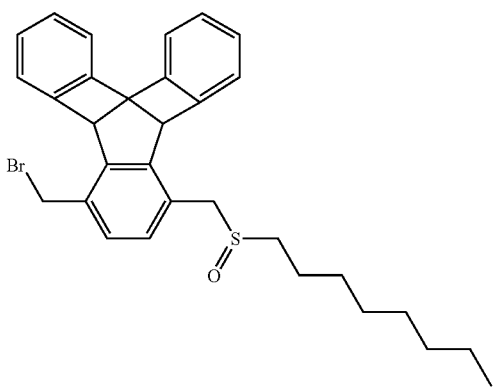 [SMILES: CCCCCCCCS(=O)Cc1ccc(CBr)c2c1C1c3ccccc3C13c1ccccc1C23]

has been synthesized via the following synthetic scheme:

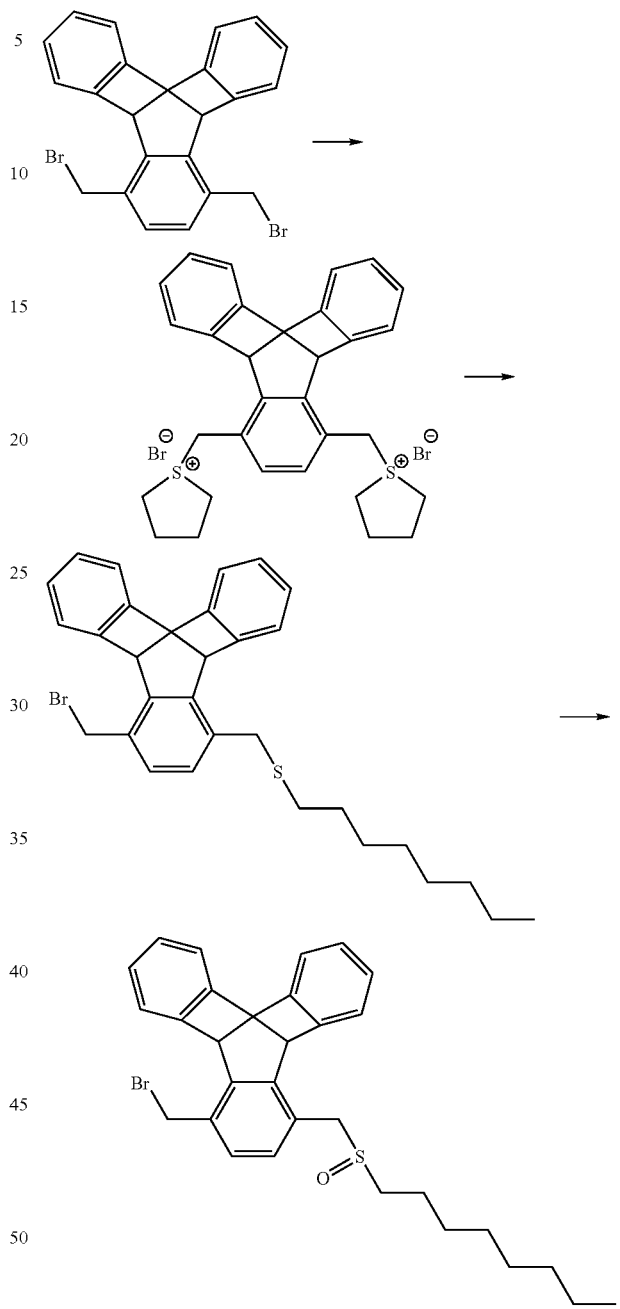

and characterized as:

$^1$H NMR (CDCl$_3$): chemical shifts at 7.50 ppm (q, 4H), 7.06 ppm (m, 4H), 7.00 ppm (q, 1H), 6.90 ppm (q, 1H), 5.88 ppm (m, 2H), 4.80 and 4.70 ppm (s, 2H), 4.54 and 4.17 ppm (d, 2H), 2.84 and 2.51 ppm (m, 2H), 1.65 and 1.49 ppm (m, 2H), 1.41-1.05 ppm (m, 10H) and 0.92 ppm (m, 3H);

FT-IR (υ, cm$^{-1}$): 2955, 2925, 2853, 1458, 1201, 1043, 774, 746, 717

This monomer was reacted with a monomer 1-[2-[(octylsulfinyl)methyl]-5-(bromomethyl)-4-methoxyphenoxy]-3,7-dimethyloctane of the following formula:

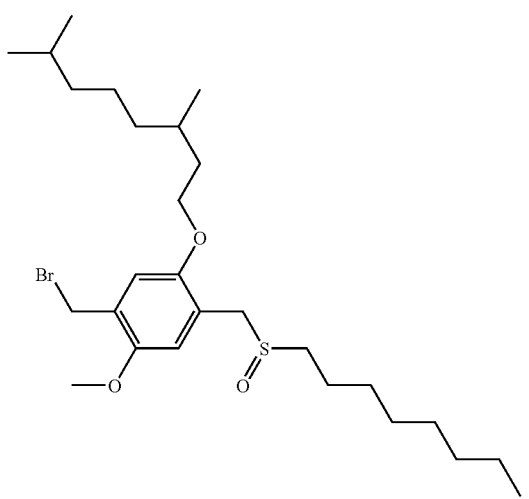 [SMILES: CCCCCCCCS(=O)Cc1cc(OC)c(CBr)cc1OCCC(C)CCCC(C)C]

synthesized and characterized as described in the article: Title: Highly selective route to unsymmetrically substituted 1-{2-[(butylsulfanyl)methyl]-5-(chloromethyl)-4-methoxyphenoxy}-3,7-dimethyloctane and isomers toward synthesis of conjugated polymer OC1C10 used in LEDs: Synthesis and optimization Author(s): Lutsen, L J; van Breemen, A J; Kreuder, W. et al. Source: HELVETICA CHIMICA ACTA Volume: 83 Issue: 12 Pages: 3113-3121 Published: 2000. Equal amounts of mol of 1-bromomethyl-4-(n-oethylsulfoxymethyl)-9,10-dihydro-9,10-o-benzenoanthracene and 1-[2-[(octylsulfinyl)methyl]-5-(bromo methyl)-4-methoxyphenoxy]-3,7-dimethyloctane were dissolved in s-butanol.

An excess of base (1.3 eq) was also dissolved in s-butanol, flushed for 1 h with Ar and added in one go at 30° C. The mixture was left to react at 30° C. for 1 h under Ar-flow, before doing a precipitation in ice water. The water was neutralized with HCl (1N), extracted with $CHCl_2$ and solvent was removed. The yellow oily precursor polymer was precipitated in MeOH at 0° C., filtered off and dried.

This lead to the following precursor polymer in 84% yield:

Characterization:

GPC (polystyrene standards): Mw=49.900, PD=2.1

$^1$H NMR ($CDCl_3$, ppm): chemical shifts are very broad $^{13}$C NMR ($CDCl_3$, ppm): 151.26 (2C), 144.53 (6C), 127.17 (4C), 125.13 (4C), 123.55 (6C), 114.77-110.99 (2C), 66.93 (1C), 58.00 (1C), 55.57 (1C), 49.64 (5C), 39.13 (1C), 37.30 (1C), 36.42 (1C), 31.57 (3C), 29.80 (1C), 28.86 (6C), 27.80 (1C), 24.55 (1C), 22.53 (2C), 22.42 (6C), 19.54 (1C), 13.90 (2C)

UVVis: $\lambda_{max}$=302 nm

FT-IR ($\upsilon$, $cm^{-1}$): 2954, 2925, 2853, 1508, 1464, 1405, 1214, 1045, 744

Example 13

Conversion of the Precursor Co-Polymer of Example 12 into a Conjugated Co-Polymer Comprising Iptycenylene Vinylene and Phenylene Vinylene Units The precursor polymer of example 12 was solved in chlorobenzene. The solution was left to react at 120° C. for 2 h in the presence of Ar and afterwards cooled down. The solution was concentrated under vacuo, redissolved in $CH_2Cl_2$ and precipitated in cold MeOH to lead a conjugated co-polymer of the following formula:

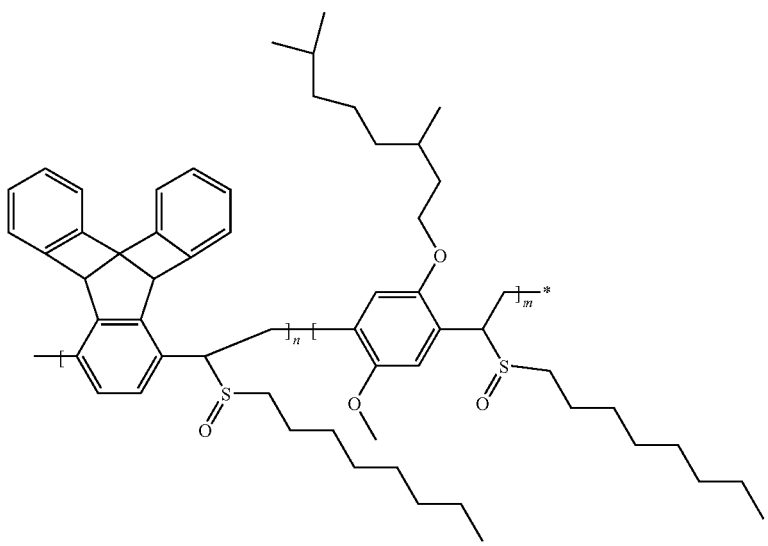

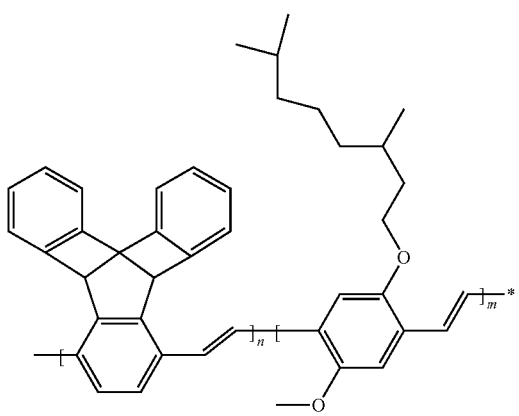

The yield was 95%

Characterization:

GPC (polystyrene standards): Mw=96.100, PD=2.8

$^{13}$C NMR (CDCl$_3$, ppm): 151.31 (2C), 144.97 (6C), 143.11 (2C), 132.27 (2C), 127.04 (4C), 125.18 (4C), 123.70 (4C), 110.16 (2C), 67.58 (1C), 56.55 (1C), 49.88 (2C), 39.16 (1C), 37.30 (1C), 36.44 (1C), 31.57 (1C), 30.04 (1C), 28.85 (1C), 27.83 (1C), 24.65 (1C), 22.56 ppm (1C), 22.47 (1C), 19.77 (1C)

UVVis: $\lambda_{max}$=460 nm

FT-IR ($\upsilon$, cm$^{-1}$): 2955, 2927, 2870, 1499, 1458, 1412, 1205, 965, 766

What is claimed is:

1. A method for the preparation of a polymer, the method comprising:
providing a first monomer having a general formula (I):

providing a second monomer having a general formula (XXI):

and reacting said first monomer and said second monomer with a basic compound in a presence of an organic solvent, whereby a polymer of general formula (IV) is obtained:

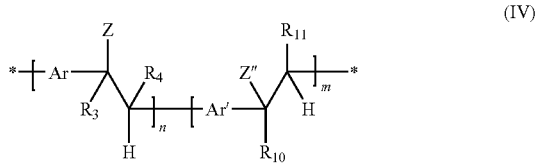

wherein:
Ar is substituted or unsubstituted, and is selected from the group consisting of triptycenylene, pentiptycenylene, and iptycenylene;
Ar' is selected from the group consisting of arylene and heteroarylene, wherein Ar' is unsubstituted or substituted with one or more substituents independently selected from the group consisting of C$_{1-20}$ alkyl, C$_{1-20}$ alkoxy, C$_{1-20}$ alkylsulfate, poly(ethylene oxide), oligo(ethylene oxide), aryl, and aryl-(C$_{1-4}$ alkyl), wherein said heteroarylene comprises up to 4 heteroatoms independently selected from the group consisting of oxygen, sulfur, and nitrogen;
Z, Z', Z", and Z"' are independently selected from the group consisting of —S(O)R" and —SC(S)R$_0$;
R$_3$, R$_4$, R$_{10}$ and R$_{11}$ are independently selected from the group consisting of hydrogen, C$_{1-20}$ alkyl, cyclic C$_{3-20}$ alkyl, aryl, alkylaryl, arylalkyl, and heterocyclyl;
R$_0$ is selected from the group consisting of —NR$_1$R$_2$, C$_{1-20}$ alkyloxy, aryloxy, alkyl, aryl, alkylaryl, arylalkyl, thioether, ester, carboxylic acid and heterocyclyl;
R$_1$ and R$_2$ are independently selected from the group consisting of C$_{1-20}$ alkyl, C$_{3-20}$ cycloalkyl, aryl, C$_{1-4}$ alkylaryl, aryl C$_{1-4}$ alkyl, and heterocyclyl, or R$_1$ and R$_2$ are linked together to form a cycle comprising 4 to 8 carbons;
R$_5$ is C$_{1-10}$ alkyl;
R" is selected from the group consisting of C$_{1-10}$ alkyl and aryl;
n is from 5 to 2000; and
m is from 0 to 2000.

2. The method of claim 1, wherein Z and Z" are independently selected from the group consisting of —S(O)R" and —SC(S)R$_0$.

3. The method of claim 1, wherein m=0.

4. The method of claim 1, further comprising:
subjecting the polymer of a general formula (IV):

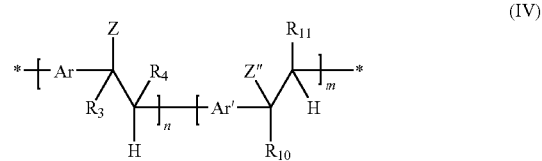

to a thermal conversion step at a temperature between 30° C. and 300° C., whereby a polymer is obtained comprising structural units of a formula (XXX):

5. The method of claim 4, wherein the polymer of general formula (IV) comprises more than 25% of repeat units of a formula (XXX):

6. The method of claim 5, wherein the polymer of general formula (IV) corresponds to a general formula (XXIII):

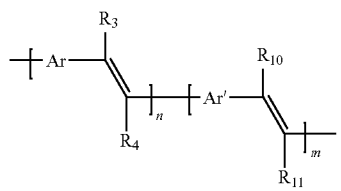
(XXIII)

wherein:
Ar is substituted or unsubstituted, and is selected from the group consisting of triptycenylene, pentiptycenylene, and iptycenylene;
Ar' is selected from the group consisting of arylene and heteroarylene, wherein Ar' is unsubstituted or substituted with one or more substituents independently selected from the group consisting of $C_{1-20}$ alkyl, $C_{1-20}$ alkoxy, $C_{1-20}$ alkylsulfate, poly(ethylene oxide), oligo(ethylene oxide), aryl, and aryl-($C_{1-4}$ alkyl), wherein said heteroarylene comprises up to 4 heteroatoms independently selected from the group consisting of oxygen, sulfur, and nitrogen;
$R_3$, $R_4$, $R_{10}$ and $R_{11}$ are independently selected from the group consisting of hydrogen, $C_{1-20}$ alkyl, cyclic $C_{3-20}$ alkyl, aryl, alkylaryl, arylalkyl, and heterocyclyl;
n is from 1 to 2000; and m is from 0 to 2000,
with the proviso that n/(n+m) is more than 0.25 and that when m is 0, Ar is not

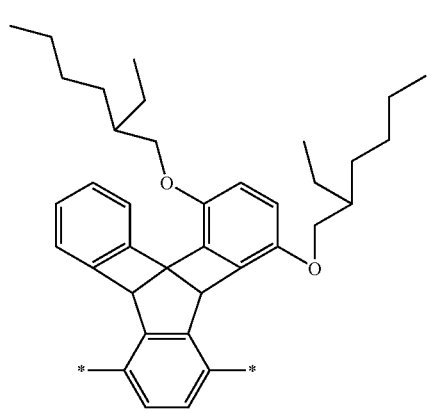 [SMILES: *c1ccc(*)c2c1C1c3ccccc3C13c1c(OCC(CC)CCCC)ccc(OCC(CC)CCCC)c1C23]

wherein both asterisks indicate points of attachment of the Ar group in each Ar-containing monomeric moiety in the general formula (XXIII).
7. The method of claim 1, further comprising:
applying on a substrate the polymer having a general formula (IV):

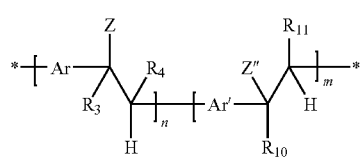
(IV)

and subjecting said polymer to at least one of a heat treatment and an acid treatment, whereby said polymer is converted into a polymer comprising more than 25% of repeat units of general formula (XXX):

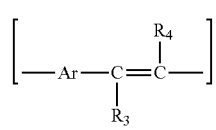
(XXX)

8. The method of claim 1, wherein the polymer has a molecular weight above 10000 daltons.

9. The method of claim 1, wherein the polymer has a polydispersity in a range of from 1 to 15.

10. The method of claim 1, wherein the polymer has a polydispersity in a range of from 2 to 3.

11. The method of claim 1, wherein the polymer has a formula:

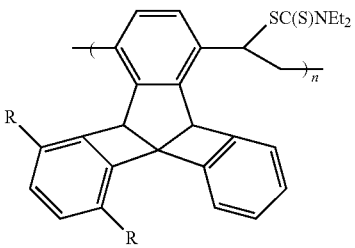

wherein R is hydrogen.

12. The method of claim 1, wherein the polymer has a formula:

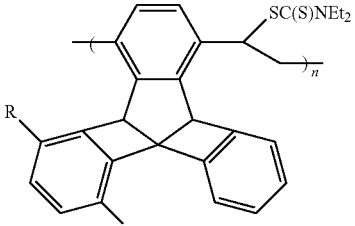

wherein R is 2-ethylhexyloxy.

* * * * *

UNITED STATES PATENT AND TRADEMARK OFFICE
CERTIFICATE OF CORRECTION

PATENT NO.       : 8,449,985 B2
APPLICATION NO.  : 12/435198
DATED            : May 28, 2013
INVENTOR(S)      : Lutsen et al.

It is certified that error appears in the above-identified patent and that said Letters Patent is hereby corrected as shown below:

In the Specification

In column 3 at line 16, Change "F." to --F,--.

In column 3 at line 54, Change "Ar" to --Ar'--.

In column 6 at lines 5-14 (approx.), Change

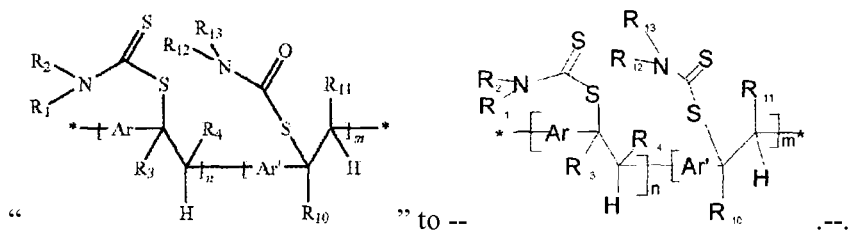

In column 8 at line 8, Change "(ter-butyl)," to --(tert-butyl),--.

In column 9 at line 3, Change "fluoranthenyl," to --fluoranthrenyl,--.

In column 10 at line 34, Change "thiamorpholinyl," to --thiomorpholinyl,--.

In column 10 at line 43, Change "quinoleinyl, oxyquinoleinyl," to --quinolinyl, oxyquinolinyl,--.

In column 14 at line 34, Change "$R_O$" to --$R_0$--.

In column 16 at line 34 (approx.), Change "dyil;" to --diyl;--.

In column 16 at line 38 (approx.), Change "phenantrene-" to --phenanthrene- --.

In column 16 at line 38 (approx.), Change "-dihydrophenantrene-" to -- -dihydrophenanthrene- --.

In column 21 at line 1, Change "hererotriptycene" to --heterotriptycene--.

In column 21 at line 44, Change "dyil;" to --diyl;--.

In column 21 at line 48, Change "phenantrene-" to --phenanthrene- --.

In column 21 at line 48, Change "-dihydrophenantrene-" to -- -dihydrophenanthrene- --.

In column 22 at line 33 (approx.), Change "nucleophillic" to --nucleophilic--.

In column 23 at line 24 (approx.), Change "Et" to --Et.--.

Signed and Sealed this
Twenty-fourth Day of December, 2013

Margaret A. Focarino
*Commissioner for Patents of the United States Patent and Trademark Office*

CERTIFICATE OF CORRECTION (continued)

In column 24 at line 61, Change "C1-C20-" to --$C_1$-$C_{20}$- --.

In column 24 at line 61, Change "C3-C20-" to --$C_3$-$C_{20}$- --.

In column 25 at line 31, Change "dyil;" to --diyl;--.

In column 25 at line 35, Change "phenantrene-" to --phenanthrene- --.

In column 25 at line 35, Change "-dihydrophenantrene-" to -- -dihydrophenanthrene- --.

In column 27 at line 1, Change "nucleophillic" to --nucleophilic--.

In column 27 at line 60, Change "dyil;" to --diyl;--.

In Column 27 at line 64, Change "phenantrene-" to --phenanthrene- --.

In column 27 at line 64, Change "-dihydrophenantrene-" to -- -dihydrophenanthrene- --.

In column 29 at line 61, Change "dyil;" to --diyl;--.

In column 29 at line 65, Change "phenantrene-" to --phenanthrene- --.

In column 29 at line 65, Change "-dihydrophenantrene-" to -- -dihydrophenanthrene- --.

In column 36 at line 32, Change "HOClO,HOClO$_2$ and HOIO$_3$." to --HOClO,HOClO2 and HOIO3.--.

In column 36 at line 56, Change "furanecarboxylic" to --furancarboxylic--.

In column 40 at line 65, Change "130° C.)" to --130° C.).--.

In column 41 at line 10, Change "trypticene" to --triptycene--.

In column 41 at lines 11-12, Change "trypticene" to --triptycene--.

In column 42 at line 21, Change "tryticene" to --triptycene--.

In column 42 at line 51, Change "12H);" to --12H).--.

In column 42 at line 57, Change "trypticene" to --triptycene--.

In column 44 at line 59, Change "FIG. 2" to --FIG. 2.--.

In column 45 at line 49, Change "then" to --than--.

In column 45 at line 67, Change "(XIII)" to --(XIII).--.

In column 47 at line 46, Change "(n-octhylsulfoxymethyl)" to --(n-octylsulfoxymethyl)--.

In column 50 at line 14, Change "(2C)" to --(2C).--.

In the Claims

In column 52 at line 43-52 (approx.), In Claim 4, change

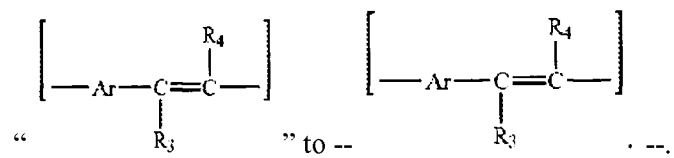

In column 52 at line 55, In Claim 5, after "of" delete "a".

CERTIFICATE OF CORRECTION (continued)

U.S. Pat. No. 8,449,985 B2

In column 52 at lines 59-63 (approx.), In Claim 5, change

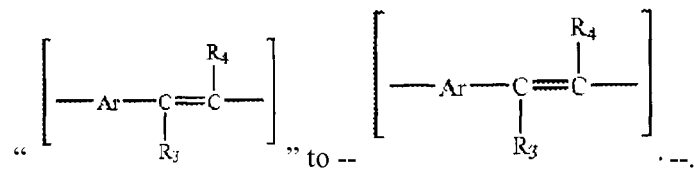

" to --  --.

In column 54 at lines 8-14 (approx.), In Claim 7, change

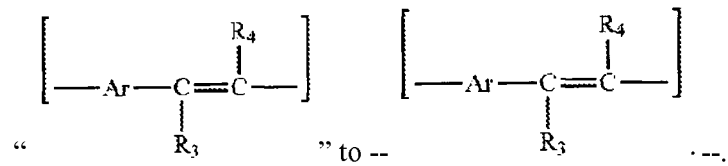

" to --  --.